(12) United States Patent
Zho et al.

(10) Patent No.: US 10,288,713 B2
(45) Date of Patent: May 14, 2019

(54) MAGNETIC RESONANCE IMAGING APPARATUS AND METHOD THEREOF

(71) Applicant: SAMSUNG ELECTRONICS CO., LTD., Suwon-si (KR)

(72) Inventors: Sang-young Zho, Suwon-si (KR); Dae-ho Lee, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 171 days.

(21) Appl. No.: 15/390,129

(22) Filed: Dec. 23, 2016

(65) Prior Publication Data

US 2017/0234957 A1 Aug. 17, 2017

(30) Foreign Application Priority Data

Feb. 17, 2016 (KR) .................. 10-2016-0018549

(51) Int. Cl.
*G01R 33/565* (2006.01)
*G01R 33/44* (2006.01)
(Continued)

(52) U.S. Cl.
CPC ..... *G01R 33/56545* (2013.01); *G01R 33/443* (2013.01); *G01R 33/4818* (2013.01);
(Continued)

(58) Field of Classification Search
CPC ............ G01R 33/56545; G01R 33/443; G01R 33/4818; G01R 33/5615
See application file for complete search history.

(56) References Cited

U.S. PATENT DOCUMENTS 6,275,037 B1* 8/2001 Harvey ................ G01R 33/561
324/307
7,847,546 B2 12/2010 Takizawa et al.
(Continued)

FOREIGN PATENT DOCUMENTS

EP 0803740 A1 10/1997
EP 2454992 A1 5/2012
(Continued)

OTHER PUBLICATIONS

Search Report dated Mar. 24, 2017, issued by the International Searching Authority in counterpart International Patent Application No. PCT/KR2016/014864 (PCT/ISA/210).
(Continued)

Primary Examiner — G.M. A Hyder
(74) Attorney, Agent, or Firm — Sughrue Mion, PLLC

(57) ABSTRACT

A magnetic resonance imaging (MRI) apparatus for obtaining a magnetic resonance (MR) image, based on a multi-echo sequence, and a method of the MRI apparatus are provided. The MRI apparatus includes a data obtainer configured to obtain first echo data, based on an echo that is generated at a first echo time, and obtain second echo data, based on an echo that is generated at a second echo time later than the first echo time, the first echo data including a part overlapping a part included in the second echo data in a k-space. The MRI apparatus further includes an image processor configured to reconstruct the MR image, based on the first echo data and the second echo data.

17 Claims, 25 Drawing Sheets

(51) Int. Cl.
  *G01R 33/48* (2006.01)
  *G01R 33/561* (2006.01)

(52) U.S. Cl.
  CPC ...... *G01R 33/5611* (2013.01); *G01R 33/5615* (2013.01); *G01R 33/5616* (2013.01); *G01R 33/482* (2013.01); *G01R 33/56554* (2013.01); *G01R 33/56563* (2013.01)

(56) References Cited

U.S. PATENT DOCUMENTS

| | | | |
|---|---|---|---|
| 8,890,525 | B2 | 11/2014 | Kusahara et al. |
| 9,513,356 | B2 | 12/2016 | Kamada et al. |
| 2001/0026155 | A1 | 10/2001 | Lehr |
| 2010/0013475 | A1* | 1/2010 | Kimura ............ A61B 5/055 324/307 |
| 2010/0260403 | A1* | 10/2010 | Takizawa ......... A61B 5/055 382/131 |
| 2012/0249143 | A1 | 10/2012 | Umeda |
| 2013/0307539 | A1 | 11/2013 | Pfeuffer et al. |
| 2014/0285195 | A1 | 9/2014 | Stemmer |
| 2014/0361771 | A1 | 12/2014 | Kamada et al. |
| 2015/0160321 | A1 | 6/2015 | Patil et al. |

FOREIGN PATENT DOCUMENTS

| | | |
|---|---|---|
| JP | 2006061235 A | 3/2006 |
| JP | 4763142 B2 | 8/2011 |
| KR | 10-2013-0129860 A | 11/2013 |
| KR | 10-2014-0116827 A | 10/2014 |
| WO | 2012/160971 A1 | 11/2012 |
| WO | 2015/161386 A1 | 10/2015 |

OTHER PUBLICATIONS

Written Opinion dated Mar. 24, 2017, issued by the International Searching Authority in counterpart International Patent Application No. PCT/KR2016/014864 (PCT/ISA/237).

Communication dated Apr. 14, 2017, issued by the Korean Intellectual Property Office in counterpart Korean Patent Application No. 10-2016-0018549.

Communication dated Feb. 18, 2019, issued by the European Patent Office in counterpart European Patent Application No. 16890770.7.

* cited by examiner

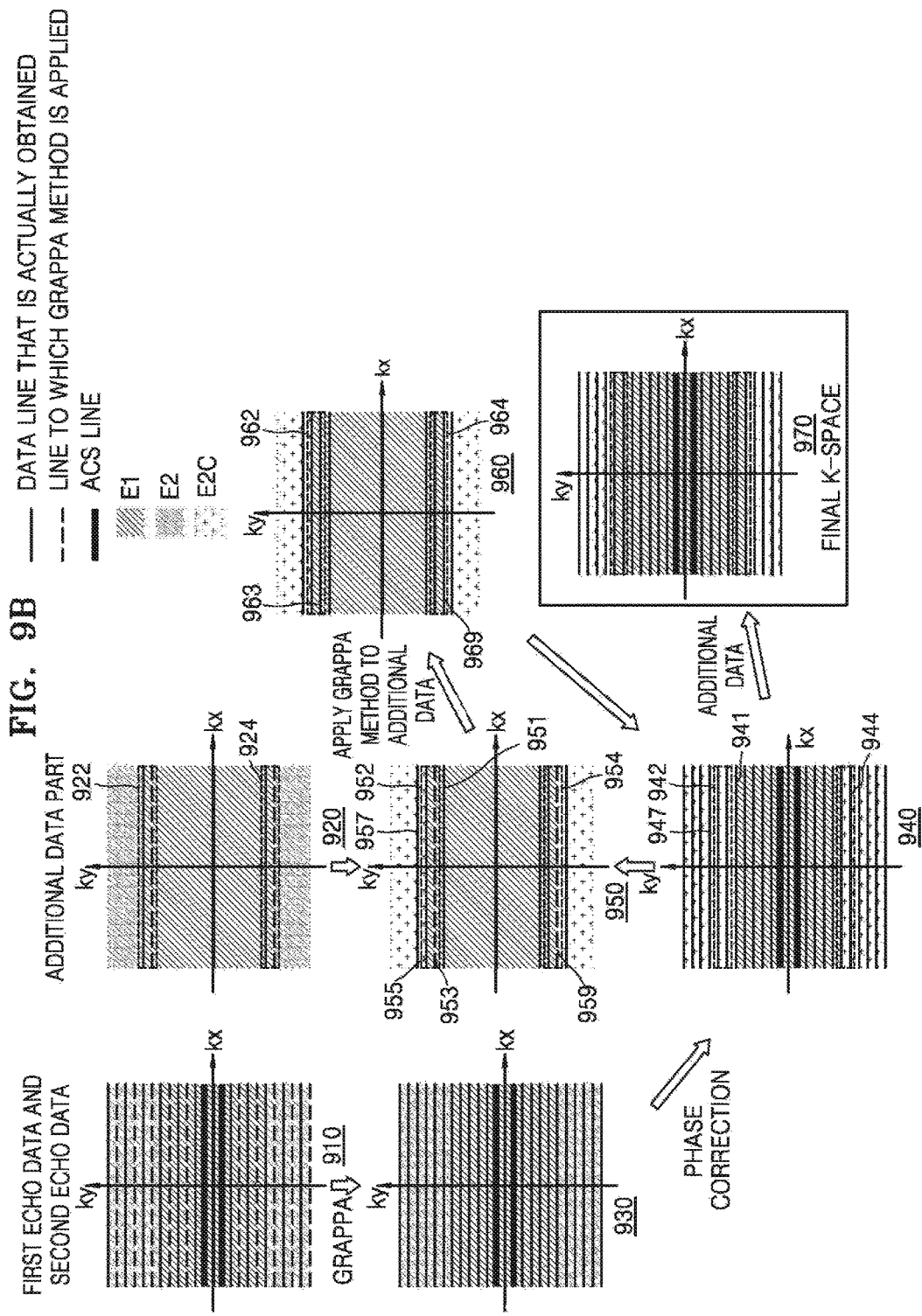

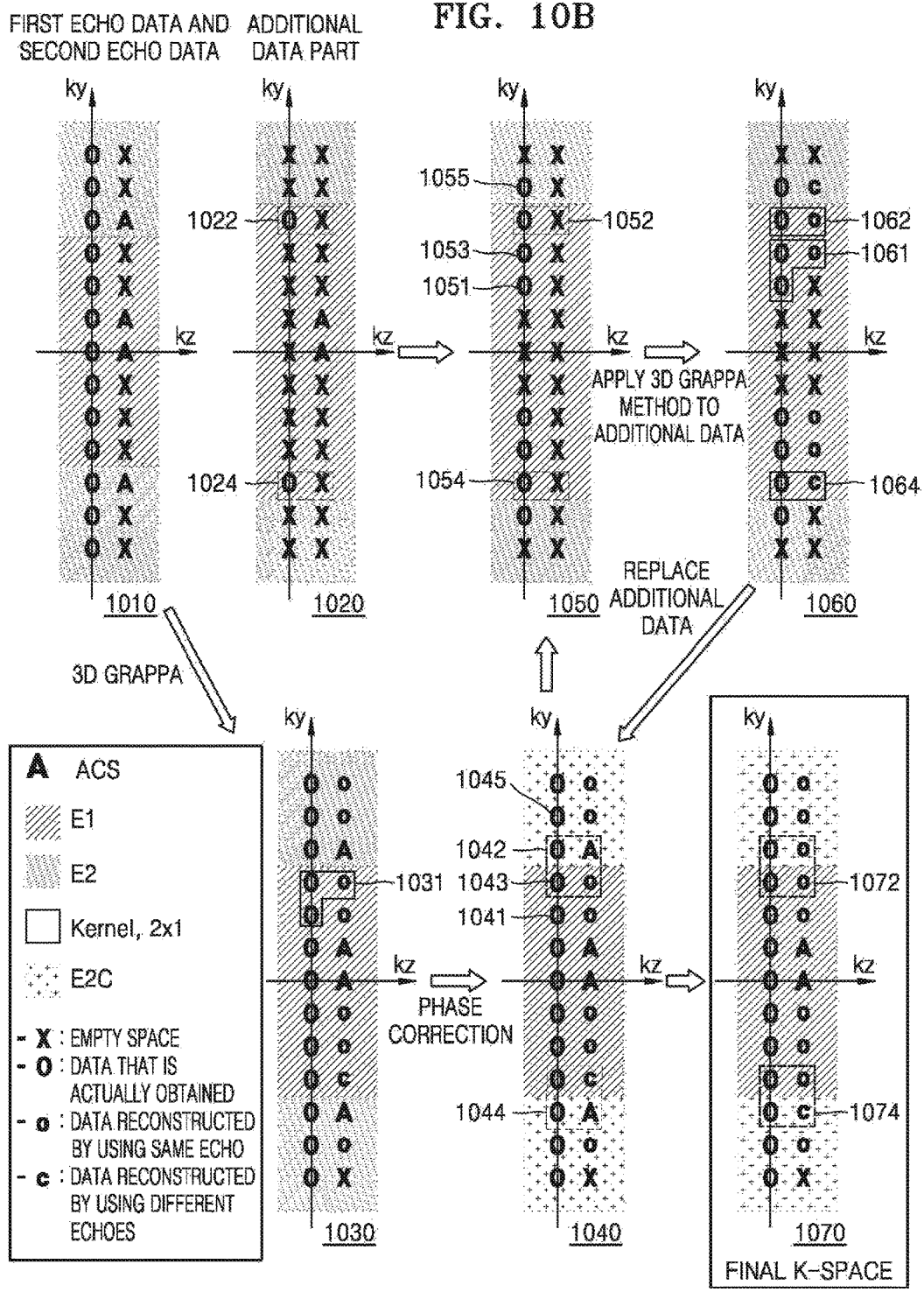

MAGNETIC RESONANCE IMAGING APPARATUS AND METHOD THEREOF

CROSS-REFERENCE TO RELATED APPLICATION

This application claims priority from Korean Patent Application No. 10-2016-0018549, filed on Feb. 17, 2016, in the Korean Intellectual Property Office, the disclosure of which is incorporated herein by reference in its entirety.

BACKGROUND

1. Field

Apparatuses and methods consistent with exemplary embodiments relate to magnetic resonance imaging (MRI) apparatuses and methods thereof, and more particularly, to MRI apparatuses for obtaining magnetic resonance (MR) images by using multi-echo sequences and methods of the MRI apparatuses.

2. Description of the Related Art

Magnetic resonance imaging (MRI) apparatuses for imaging subjects by using magnetic fields may show stereoscopic images of bones, lumbar discs, joints, nerve ligaments, hearts, etc. at desired angles.

An MRI apparatus is advantageous in that the MRI apparatus is noninvasive, exhibits an excellent tissue contrast as compared to a computerized tomography (CT) apparatus, and does not have artifacts due to bone tissue. Also, because the MRI apparatus may capture various cross-sectional images in desired directions without moving an object, the MRI apparatus is widely used with other imaging apparatuses.

An MRI apparatus may obtain k-space data by using a multi-echo sequence. In detail, when a multi-echo sequence is used, a time taken to capture an image may be reduced by exciting one radio frequency (RF) pulse and then obtaining an MR signal by using a plurality of generated echoes.

When an MRI apparatus uses a multi-echo sequence, the MRI apparatus may use a method of obtaining a plurality of pieces of k-space data respectively corresponding to a plurality of echo times by applying a gradient magnetic field for phase encoding only once during one repetition time (TR).

Alternatively, the MRI apparatus may use a method of obtaining one piece of k-space data by using a plurality of echoes that are generated during one TR. This method is referred to as an echo-planar imaging (EPI) method.

A multi-echo sequence may be based on gradient echoes or spin echoes. If a multi-echo sequence is based on gradient echoes, because a sign of a readout gradient magnetic field has to be continuously reversed, an MRI apparatus may have high performance to generate a gradient magnetic field. As the performance of an MRI apparatus has recently been improved, not only a TR may be reduced when gradient echoes are used but also an image having a desired contrast ratio may be obtained.

SUMMARY

Exemplary embodiments may address at least the above problems and/or disadvantages and other disadvantages not described above. Also, the exemplary embodiments are not required to overcome the disadvantages described above, and may not overcome any of the problems described above.

Exemplary embodiments may improve the quality of a reconstructed final image by obtaining additional data about an overlapping part between first echo data and second echo data, which are obtained at different echo times, in a k-space to obtain a magnetic resonance (MR) image.

Exemplary embodiments may reduce the effects of blur or aliasing that may occur in a final image as pieces of data obtained at different echo times are used by performing phase correction on first echo data and second echo data obtained at different echo times.

According to an aspect of an exemplary embodiment, there is provided a magnetic resonance imaging (MRI) apparatus for obtaining a magnetic resonance (MR) image, based on a multi-echo sequence, the MRI apparatus including a data obtainer configured to obtain first echo data, based on an echo that is generated at a first echo time, and obtain second echo data, based on an echo that is generated at a second echo time later than the first echo time, the first echo data including a part overlapping a part included in the second echo data in a k-space. The MRI apparatus further includes an image processor configured to reconstruct the MR image, based on the first echo data and the second echo data.

The image processor may be further configured to perform phase correction on either one or both of the first echo data and the second echo data, and reconstruct the MR image, based on either one or both of the first echo data and the second echo data on which the phase correction is performed.

Either one or each of the first echo data and the second echo data may include data of a central part of the k-space.

The image processor may be further configured to perform phase correction, based on a phase of the data of the central part of the k-space among the first echo data and the second echo data.

The MRI apparatus may further include a gradient magnetic field controller configured to control a gradient magnetic field that is applied, based on the multi-echo sequence, and a sign of a readout gradient magnetic field that is applied at the first echo time may be the same as a sign of a readout gradient magnetic field that is applied at the second echo time.

The data obtainer may be further configured to, in response to the first echo data including data of a central part of the k-space and the second echo data not including the data of the central part of the k-space, obtain additional data of the overlapping part included in the first echo data, based on the echo generated at the first echo time.

The data obtainer may be further configured to, in response to the second echo data including data of a central part of the k-space and the first echo data not including the data of the central part of the k-space, obtain additional data of the overlapping part included in the second echo data, based on the echo generated at the second echo time.

The data obtainer may be further configured to determine characteristics of the MR image to be obtained, and determine that the first echo data or the second echo data is to include data of a central part of the k-space, based on the determined characteristics of the MR image.

The image processor may be further configured to generate a B0 map, based on third echo data and fourth echo data that are obtained based on an echo that is generated at a third echo time and an echo that is generated at a fourth echo time, respectively, and perform phase correction on either one or both of the first echo data and the second echo data, based on the generated B0 map.

The MRI apparatus may further include a gradient magnetic field controller configured to control a gradient magnetic field that is applied, based on the multi-echo sequence, and a sign of a readout gradient magnetic field that is applied at the third echo time may be the same as a sign of a readout gradient magnetic field that is applied at the fourth echo time.

The first echo time, the second echo time, the third echo time, and the fourth echo time may be included in a repetition time period.

The image processor may be further configured to reconstruct k-space data, based on another part of the first echo data other than the overlapping part included in the first echo data in the k-space, and the second echo data, perform phase correction on the second echo data included in the reconstructed k-space data, and re-reconstruct the k-space data, based on the overlapping part included in the first echo data, and the second echo data on which the phase correction is performed.

According to an aspect of another exemplary embodiment, there is provided a method of a magnetic resonance imaging (MRI) apparatus for obtaining a magnetic resonance (MR) image, based on a multi-echo sequence, the method including obtaining first echo data, based on an echo that is generated at a first echo time, and obtaining second echo data, based on an echo that is generated at a second echo time later than the first echo time, the first echo data including a part overlapping a part included in the second echo data in a k-space. The method further includes reconstructing the MR image, based on the first echo data and the second echo data.

The method may further include performing phase correction on either one or both of the first echo data and the second echo data, and the reconstructing may include reconstructing the MR image, based on either one or both of the first echo data and the second echo data on which the phase correction is performed.

Either one or each of the first echo data and the second echo data may include data of a central part of the k-space.

The performing may include performing the phase correction, based on a phase of the data of the central part of the k-space among the first echo data and the second echo data.

The method may further include controlling a gradient magnetic field that is applied, based on the multi-echo sequence, and a sign of a readout gradient magnetic field that is applied at the first echo time may be the same as a sign of a readout gradient magnetic field that is applied at the second echo time.

The method may further include, in response to the first echo data including data of a central part of the k-space and the second echo data not including the data of the central part of the k-space, obtaining additional data of the overlapping part included in the first echo data, based on the echo generated at the first echo time.

The method may further include, in response to the second echo data including data of a central part of the k-space and the first echo data not including the data of the central part of the k-space, obtaining additional data of the overlapping part included in the second echo data, based on the echo generated at the second echo time.

The method may further include determining characteristics of the MR image to be obtained, and determining that the first echo data or the second echo data is to include data of a central part of the k-space, based on the determined characteristics of the MR image.

The method may further include generating a B0 map, based on third echo data and fourth echo data that are obtained based on an echo that is generated at a third echo time and an echo that is generated at a fourth echo time, respectively, and performing phase correction on either one or both of the first echo data and the second echo data, based on the generated B0 map.

The method may further include controlling a gradient magnetic field that is applied, based on the multi-echo sequence, and a sign of a readout gradient magnetic field that is applied at the third echo time may be the same as a sign of a readout gradient magnetic field that is applied at the fourth echo time.

The first echo time, the second echo time, the third echo time, and the fourth echo time may be included in a repetition time period.

The reconstructing may include reconstructing k-space data, based on another part of the first echo data other than the overlapping part included in the first echo data in the k-space, and the second echo data, performing phase correction on the second echo data included in the reconstructed k-space data, and re-reconstructing the k-space data, based on the overlapping part included in the first echo data, and the second echo data on which the phase correction is performed.

A non-transitory computer-readable storage medium may store a program for causing a computer to execute the method.

According to an aspect of another exemplary embodiment, there is provided a magnetic resonance imaging (MRI) apparatus for obtaining a magnetic resonance (MR) image, based on a multi-echo sequence, the MRI apparatus including a data obtainer configured to obtain first echo data, based on an echo that is generated at a first echo time, obtain second echo data, based on an echo that is generated at a second echo time later than the first echo time, and obtain third echo data, based on an echo that is generated at a third echo time later than the second echo time, the second echo data including a part overlapping a part included in the third echo data in a k-space. The MRI apparatus further includes an image processor configured to reconstruct the MR image, based on the first echo data, the second echo data, and the third echo data.

The image processor may be further configured to perform phase correction on the third echo data, obtain k-space data, based on the second echo data and the third echo data on which the phase correction is performed, the first echo data including a part overlapping a part included in the k-space data in the k-space, perform phase correction on the k-space data, and reconstruct the k-space data, based on the first echo data and the k-space data on which the phase correction is performed.

The image processor may be further configured to perform phase correction on the first echo data, obtain k-space data, based on the second echo data and the first echo data on which the phase correction is performed, the third echo data including a part overlapping a part included in the k-space data in the k-space, perform phase correction on the k-space data, and reconstruct the k-space data, based on the third echo data and the k-space data on which the phase correction is performed.

BRIEF DESCRIPTION OF THE DRAWINGS

The above and/or other aspects will become apparent and more readily appreciated from the following description of exemplary embodiments, taken in conjunction with the accompanying drawings in which:

FIG. 9B is a diagram illustrating a process of reconstructing k-space data by applying a generalized autocalibrating partially parallel acquisition (GRAPPA) method to the first echo data and the second echo data obtained by the MRI apparatus of FIG. 3A or 3B, according to an exemplary embodiment;

FIG. 10B is a diagram illustrating a process of reconstructing k-space data by applying a GRAPPA method to the first echo data and the second echo data obtained by the MRI apparatus of FIG. 3A or 3B, using a multi-band method, according to an exemplary embodiment;

DETAILED DESCRIPTION

Figure 1:
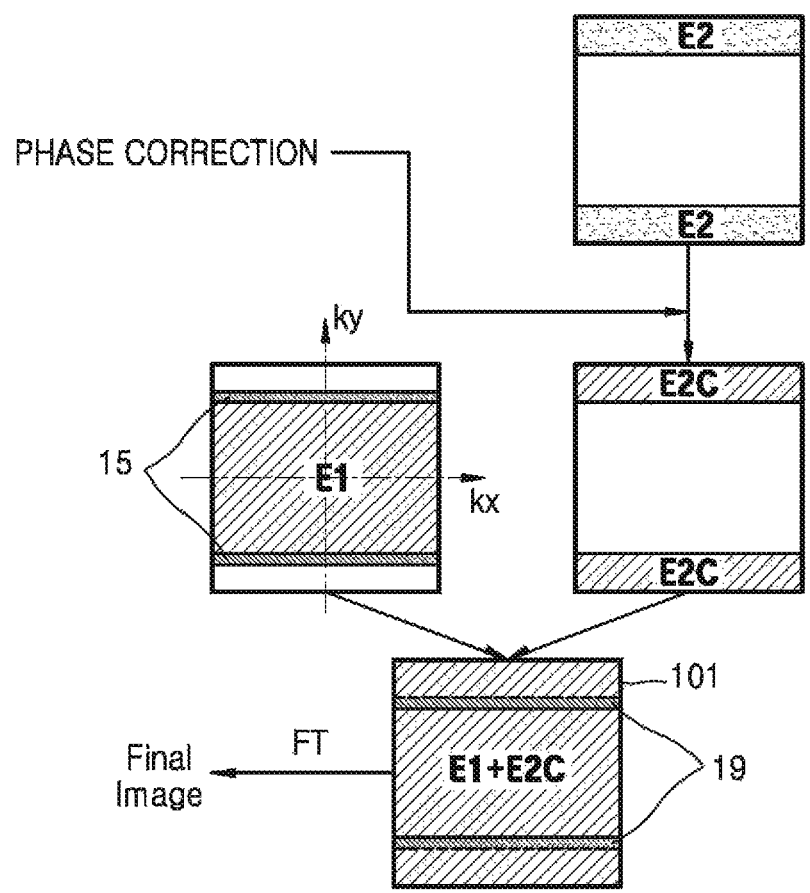
FIG. 1 is a diagram illustrating a process performed by an MRI apparatus to obtain an MR image, based on a multi-echo sequence, according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions may not be described in detail because they would obscure the description with unnecessary detail.

Hereinafter, the terms used in the specification will be briefly described, and then the present disclosure will be described in detail.

The terms used in this specification are those general terms currently widely used in the art in consideration of functions regarding the present disclosure, but the terms may vary according to the intention of one of ordinary skill in the art, precedents, or new technology in the art. Also, some terms may be arbitrarily selected by the applicant, and in this case, the meaning of the selected terms will be described in detail in the detailed description of the present specification. Thus, the terms used herein have to be defined based on the meaning of the terms together with the description throughout the specification.

When a part "includes" or "comprises" an element, unless there is a description contrary thereto, the part can further include other elements, not excluding the other elements. Also, the term "unit" in the exemplary embodiments means a software component or hardware component such as a field-programmable gate array (FPGA) or an application-specific integrated circuit (ASIC), and performs a specific function. However, the term "unit" is not limited to software or hardware. The "unit" may be formed to be in an addressable storage medium, or may be formed to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units," or may be divided into additional components and "units."

Reference will now be made in detail to embodiments, examples of which are illustrated in the accompanying drawings. In the following description, well-known functions or constructions may not be described in detail so as not to obscure the exemplary embodiments with unnecessary detail.

Throughout the specification, an "image" may denote multi-dimensional data composed of discrete image elements (for example, pixels in a two-dimensional (2D) image and voxels in a three-dimensional (3D) image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. The object may be a phantom. The phantom means a material having a density, an effective atomic number, and a volume that are approximately the same as those of an organism. For example, the phantom may be a spherical phantom having properties similar to the human body.

Furthermore, in the present specification, a "user" may be, but is not limited to, a medical expert, such as a medical doctor, a nurse, a medical laboratory technologist, or a technician who repairs a medical apparatus.

Furthermore, in the present specification, an "MR image" refers to an image of an object obtained by using the nuclear magnetic resonance principle.

Furthermore, in the present specification, a "pulse sequence" refers to continuity of signals repeatedly applied by an MRI apparatus. The pulse sequence may include a time parameter of a radio frequency (RF) pulse, for example, repetition time (TR) or echo time (TE).

Also, the term 'pulse sequence diagram' used herein may refer to a diagram for explaining a sequence of signals applied in an MRI system. For example, the pulse sequence schematic diagram may be a diagram showing a radio frequency (RF) pulse, a gradient magnetic field, an MR signal, or the like according to time.

An MRI system is an apparatus for acquiring a sectional image of a part of an object by expressing, in a contrast comparison, a strength of an MR signal with respect to an RF signal generated in a magnetic field having a strength. For example, if an RF signal that only resonates an atomic nucleus (for example, a hydrogen atomic nucleus) is emitted for an instant toward the object placed in a strong magnetic field and then such emission stops, an MR signal is emitted from the atomic nucleus, and thus the MRI system may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

MRI systems include characteristics different from those of other imaging apparatuses. Unlike imaging apparatuses such as CT apparatuses that acquire images according to a direction of detection hardware, MRI systems may acquire 2D images or 3D volume images that are oriented toward an optional point. MRI systems do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are used to precisely capture abnormal tissues.

As used herein, the term "and/or" includes any and all combinations of one or more of the associated listed items. Expressions such as "at least one of," when preceding a list of elements, modify the entire list of elements and do not modify the individual elements of the list.

FIG. 1 is a diagram illustrating a process performed by an MRI apparatus to obtain an MR image, based on a multi-echo sequence, according to an exemplary embodiment.

In detail, referring to FIG. 1, an MRI apparatus according to an exemplary embodiment performs a process of reconstructing a final image based on first echo data E1 corresponding to a first echo time TE1 and second echo data E2 corresponding to a second echo time TE2.

The MRI apparatus according to an exemplary embodiment may obtain an MR signal generated based on a multi-echo sequence.

The multi-echo sequence refers to a pulse sequence used for the MRI apparatus to obtain an image by using a plurality of echoes generated after an RF pulse is applied once. That is, the multi-echo sequence may have at least two echo times during one TR.

The MR signal obtained by using the multi-echo sequence may be represented as k-space data.

The k-space data refers to a signal generated by placing an MR signal, which is an RF signal received from each of coils according to channels included in a high frequency multi-coil, in a k-space.

The k-space data may be 2D k-space data or 3D k-space data. For example, the 2D k-space data has a 2D spatial frequency domain and is formed by a kx-axis corresponding to frequency encoding and a ky-axis corresponding phase encoding. Also, the 3D k-space data is formed by the kx-axis, the ky-axis, and a kz-axis corresponding to a progress direction in a space. The kz-axis corresponds to a slice selection gradient.

The k-space data may be reconstructed into an MR image by using a fast Fourier transform (FFT) or a Fourier transform (FT).

When the multi-echo sequence is used as described above, the MRI apparatus may use a method of obtaining a plurality of pieces of k-space data corresponding to a plurality of echo times by applying a gradient magnetic field for phase encoding only once during one TR.

The MRI apparatus using the multi-echo sequence may use another method of obtaining one piece of k-space data by using a plurality of echoes generated during one TR. This method is referred to as an echo planar imaging (EPI) method.

FIG. 1 is a diagram illustrating a case where the MRI apparatus uses a method of obtaining a plurality of pieces of k-space data respectively corresponding to a plurality of echo times according to an exemplary embodiment. A square block shown in FIG. 1 indicates a k-space.

Referring to FIG. 1, the first echo data E1 may be data obtained by using an echo generated at the first echo time TE1 among a plurality of echo times included in one TR. The first echo data E1 may include data of a central part of the k-space, as shown in FIG. 1. Also, the first echo data E1 may include data whose ky-coordinate in the k-space is 0.

The second echo data E2 may be data obtained by using an echo generated at the second echo time TE2, which is later than the first echo time TE1, among the plurality of echo times included in the one TR. The second echo data E2 may not include the data of the central part of the k-space, as shown in FIG. 1. Also, the second echo data E2 may not include the data whose ky-coordinate in the k-space is 0.

The first echo data E1 and the second echo data E2 may refer to raw data or k-space data.

The raw data may be an MR signal that is an RF signal received from each of a plurality of channel coils included in a high frequency multi-coil through an MRI process.

The k-space data may be data obtained by sampling an obtained MR signal in the k-space. The k-space data may be data obtained by performing full sampling on an obtained MR signal at all points of the k-space, or may be data obtained by performing, on an obtained MR signal, under-sampling by which sampling is performed at some points and not performed at other points. Signals at non-obtained points among pieces of incomplete k-space data obtained by using under-sampling may be reconstructed by using a generalized autocalibrating partially parallel acquisition (GRAPPA) method or a simultaneous acquisition of spatial harmonics (SMASH) method using a map having additional coil information (e.g., a coil sensitivity map).

For convenience, FIG. 1 is explained on the assumption that the first echo data E1 and the second echo data E2 are k-space data that are sampled in the k-space. An arrangement of the first echo data E1 and the second echo data E2 in the k-space is not limited to that in FIG. 1, and may be modified in various ways.

Referring back to a process of obtaining an MR image of FIG. 1, the MRI apparatus according to an exemplary embodiment may obtain the first echo data E1 corresponding to the first echo time TE1 and may obtain the second echo data E2 corresponding to the second echo time TE2 that is later than the first echo time TE1.

In this case, the first echo data E1 and the second echo data E2 may include an overlapping part in the k-space. For example, the first echo data E1 may further include additional data 15 about the overlapping part in the k-space. The additional data 15 may account for, for example, about 10% of the entire k-space. In detail, when the k-space includes 256 lines to reconstruct an image having a resolution of 256*256, the additional data 15 may be obtained by using about 25 or 26 lines.

The first echo data E1 may include the data of the central part of the k-space in the k-space and may include the additional data 15, as shown in FIG. 1. In this case, the first echo data E1 may be 'reference echo data'. Also, an echo time of an echo generated in order for the MRI apparatus to obtain the reference echo data may be referred to as a 'reference echo time'.

Characteristics of a final image to be obtained may be determined based on the reference echo data of the k-space. In other words, the reference echo time may vary according to the characteristics of the final image to be obtained.

For example, when a T1-weighted image is to be obtained, the MRI apparatus according to an exemplary embodiment may determine the first echo time TE1 as the reference echo time. Also, when a T2-weighted image is to be obtained, the MRI apparatus according to an exemplary embodiment may determine the second echo time TE2, which is later than the first echo time TE1, as the reference echo time. That is, the MRI apparatus according to an exemplary embodiment may determine the reference echo time, which is an echo time of the data of the central part of the k-space, to be a time of an early echo or a late echo, according to the characteristics of the final image to be obtained.

The MRI apparatus according to an exemplary embodiment may perform phase correction on the second echo data E2. The phase correction refers to a process of correcting a phase of echo data to a phase corresponding to the reference echo time.

When pieces of data obtained at different echo times are used, the MRI apparatus according to an exemplary embodiment may be affected by an echo time shift, magnetic field inhomogeneity, spin dephasing, and eddy current.

In detail, when the MRI apparatus according to an exemplary embodiment uses pieces of data obtained at different echo times, a plurality of echo times may differ from pre-designed echo times. Also, amounts by which the echo times are shifted may differ from one another.

According to an exemplary embodiment, when the MRI apparatus uses a gradient echo pulse sequence, the MRI apparatus may be more severely affected by magnetic field inhomogeneity than an MRI apparatus using a spin echo pulse sequence.

Also, when the MRI apparatus uses a gradient echo pulse sequence, because the MRI apparatus does not use a 180° pulse unlike an MRI apparatus using a spin echo pulse sequence, the MRI apparatus may be more severely affected by spin dephasing than the MRI apparatus using the spin echo pulse sequence.

The MRI apparatus according to an exemplary embodiment may perform phase correction to reduce any one or any combination of the effects of an echo time shift, magnetic field inhomogeneity, and spin dephasing on a signal intensity.

That is, the MRI apparatus according to an exemplary embodiment may reduce the effects of blur or aliasing in the final image that may occur as pieces of data obtained at different echo times are used by performing the phase correction.

Referring to FIG. 1, when the first echo data E1 is reference echo data, the MRI apparatus according to an exemplary embodiment may perform phase correction on the second echo data E2 and may obtain corrected second echo data E2C whose phase is corrected based on the first echo time TE1.

The MRI apparatus according to an exemplary embodiment may obtain final k-space data 101 based on the first echo data E1 and the corrected second echo data E2C. Also, the MRI apparatus may reconstruct a final image based on the final k-space data 101.

The final k-space data 101 may be data reconstructed in the k-space. For example, when the first echo data E1 and the second echo data E2 are under-sampled k-space data, the final k-space data 101 may be data reconstructed by using a GRAPPA method or a SMASH method.

Overlapping data 19 of the final k-space data 101 reconstructed by the MRI apparatus according to an exemplary embodiment may be k-space data reconstructed by applying a GRAPPA method or the like to the additional data 15 of the first echo data E1.

The MRI apparatus according to an exemplary embodiment may obtain a final image by perform an FT on the final k-space data 101. The MRI apparatus according to an exemplary embodiment may reconstruct a final image by applying a method such as sensitivity encoding (SENSE) or parallel imaging with localized sensitivity (PILS) to the final k-space data 101.

The MRI apparatus according to an exemplary embodiment may improve the quality of the reconstructed final image by obtaining the additional data 15 about the overlapping part 19 in the k-space between the first echo data E1 and the second echo data E2.

Also, when the MRI apparatus according to an exemplary embodiment uses the first echo data E1 and the second echo data E2 obtained at different echo times, the MRI apparatus may increase a signal-to-noise ratio (SNR) and a contrast ratio of the final image by combining characteristics of pieces of echo data.

Also, because the MRI apparatus according to an exemplary embodiment obtains the final k-space data 101 by using the first echo data E1 and the second echo data E2 obtained at different echo times, the MRI apparatus may reduce a time taken to obtain the final image.

Figure 2A:
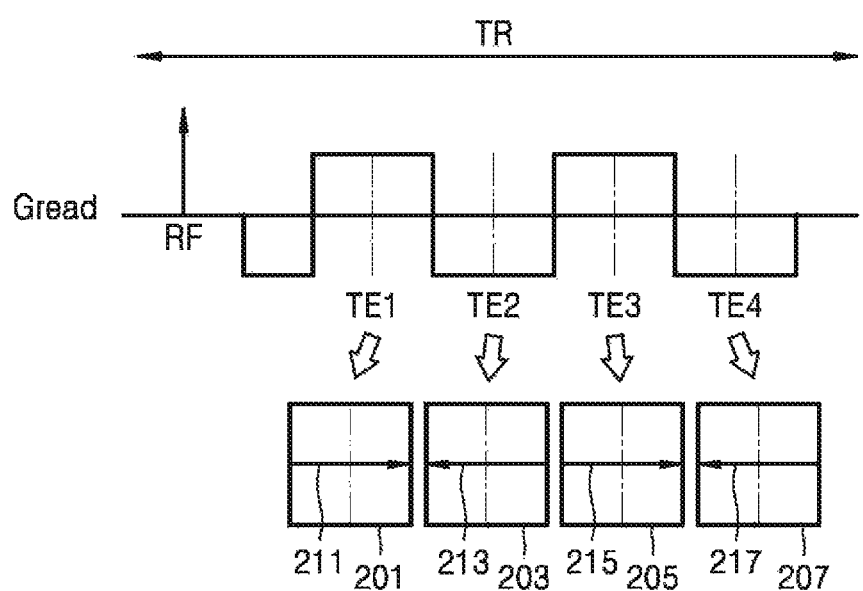
FIG. 2A is a graph illustrating a process performed by an MRI apparatus to obtain k-space data, based on a multi-echo sequence, according to an exemplary embodiment.

FIG. 2A is a graph illustrating a process performed by an MRI apparatus to obtain k-space data, based on a multi-echo sequence, according to an exemplary embodiment.

Referring to FIG. 2A, a multi-echo sequence used by the MRI apparatus according to an exemplary embodiment may be, for example, a gradient echo sequence.

The MRI apparatus according to an exemplary embodiment may excite one RF pulse, and then may generate a plurality of gradient echoes by applying readout gradient magnetic fields Gread so that the readout gradient magnetic fields Gread have the same intensity and alternating signs.

A gradient magnetic field for phase encoding is not shown in FIG. 2A for convenience of explanation of echoes generated according to the readout gradient magnetic field Gread.

Referring to FIG. 2A, the MRI apparatus according to an exemplary embodiment may generate a plurality of echoes during one TR. That is, the MRI apparatus according to an exemplary embodiment may generate echoes at the first echo time TE1, the second echo time TE2, a third echo time TE3, and a fourth echo time TE4 during one TR.

Referring to FIG. 2A, the MRI apparatus according to an exemplary embodiment may fill one line of a k-space 201 with data in a positive direction 211 by using a readout gradient magnetic field corresponding to the first echo time TE1.

Also, the MRI apparatus according to an exemplary embodiment may fill one line of a k-space 203 with data in a negative direction 213 by using a readout gradient magnetic field corresponding to the second echo time TE2.

Also, the MRI apparatus according to an exemplary embodiment may fill one line of a k-space 205 with data in a positive direction 215 by using a readout gradient magnetic field corresponding to the third echo time TE3.

Also, the MRI apparatus according to an exemplary embodiment may fill one line of a k-space 207 with in a negative direction 217 by using a readout gradient magnetic field corresponding to the fourth echo time TE4.

The MRI apparatus according to an exemplary embodiment may obtain pieces of k-space data having different characteristics by using a plurality of echo times.

For example, when an image is reconstructed by using k-space data obtained at the first echo time TE1 that is a short echo time, the MRI apparatus may obtain an image in which a T2 effect or a T2* effect is reduced and a T1 effect is increased.

Also, when an image is reconstructed by using k-space data obtained at the fourth echo time TE4 that is a long echo time, the MRI apparatus may obtain an image in which a T1 effect is reduced and a T2 effect or a T2* effect is increased.

The MRI apparatus according to an exemplary embodiment may adjust a tissue contrast, a clarity of venous blood included in a cross-sectional image, an SNR, etc. by reconstructing a final image by combining pieces of k-space data having different echo times.

Figure 2B:
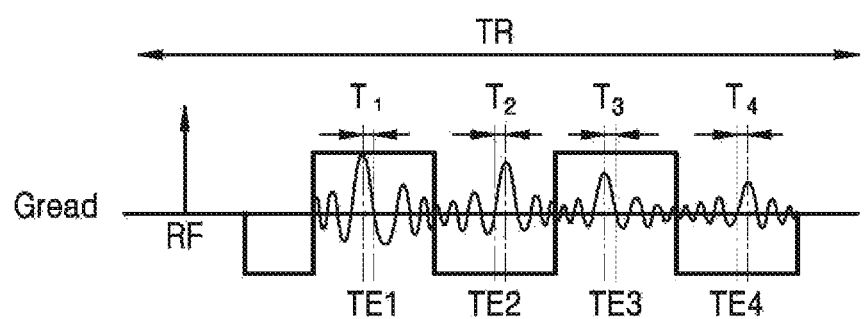
FIG. 2B is a graph illustrating a process performed by an MRI apparatus to obtain an MR image, based on a gradient echo sequence, according to an exemplary embodiment.

FIG. 2B is a graph illustrating a process performed by an MRI apparatus to obtain an MR image, based on a gradient echo sequence, according to an exemplary embodiment.

The MRI apparatus according to an exemplary embodiment may obtain an MR signal having a highest intensity at an echo time. The MR signal may be received through, for example, an RF coil included in the MRI apparatus.

The MRI apparatus according to an exemplary embodiment may place k-space data corresponding to the MR signal having the highest intensity obtained at the echo time at a position whose kx-coordinate in a k-space is 0.

For example, when the MRI apparatus fills one line of the space 201 with data in the positive direction 211 by using a readout gradient magnetic field corresponding to the first echo time TE1, as described with reference to FIG. 2A, the k-space data placed at the position whose kx-coordinate in the k-space is 0 may correspond to a highest point of an echo signal.

Referring to FIG. 2B, the MRI apparatus according to an exemplary embodiment may use a gradient echo sequence for obtaining an MR signal corresponding to the highest point of the echo signal at the first echo time TE1, the second echo time TE2, the third echo time TE3, and the fourth echo time TE4.

In this case, as shown in FIG. 2B, an echo time shift may occur in a plurality of echoes obtained by the MRI apparatus according to an exemplary embodiment during one TR. That is, an MR signal corresponding to a point other than a highest point of an echo signal may be obtained at the first echo time TE1, the second echo time TE2, the third echo time TE3, and the fourth echo time TE4 that are a plurality of echo times of echoes obtained during one TR.

For example, as shown in FIG. 2B, the first echo time TE1 may be shifted leftward by $T_1$ and the second echo time TE2 may be shifted rightward by $T_2$. Also, the third echo time TE3 may be shifted leftward by $T_3$ and the fourth echo time TE4 may be shifted rightward by $T_4$.

The MRI apparatus according to an exemplary embodiment may correct the obtained k-space data in a one-dimensional (1D) manner by compensating for an amount by which an echo time is shifted. Also, the MRI apparatus according to an exemplary embodiment may perform phase correction on pieces of data in the k-space in a 2D or 3D manner.

For example, the MRI apparatus may use a B0 map to perform phase correction. The B0 map is obtained by placing a phase or frequency difference according to an echo time difference in the k-space. In detail, the MRI apparatus may obtain the B0 map in the k-space by using a phase difference between two pieces of k-space data having an echo time difference therebetween. The MRI apparatus may obtain a frequency difference corresponding to the phase difference mapped to the B0 map. The MRI apparatus may generate the B0 map to which a color corresponding to a frequency according to the echo time difference is mapped. Such a process of performing phase correction by using a B0 map obtained by using a phase difference between two pieces of k-space data having an echo time difference may be referred to as conjugate phase reconstruction. To perform phase correction by using a B0 map, any of various well-known methods such as conjugate phase reconstruction may be used.

The MRI apparatus according to an exemplary embodiment may reduce the effects of an echo time shift of data in a k-space and may reduce the effects of blur or aliasing in an obtained final image by performing phase correction by using a B0 map.

Figure 3A:
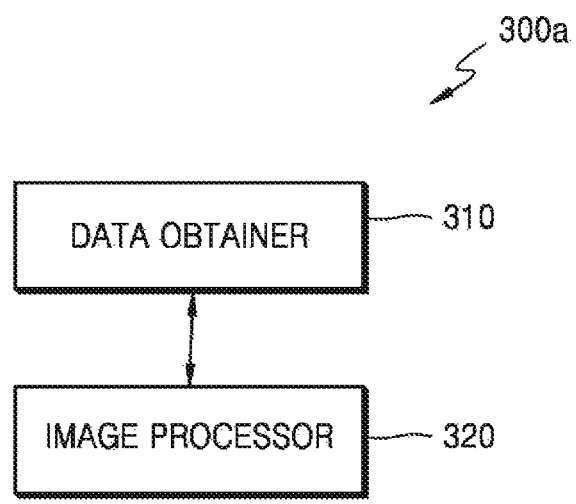
FIG. 3A is a block diagram of an MRI apparatus according to an exemplary embodiment.

FIG. 3A is a block diagram of an MRI apparatus 300a according to an exemplary embodiment.

The MRI apparatus 300a of FIG. 3A is an apparatus for obtaining an MR image by using a multi-echo sequence. In detail, the MRI apparatus 300a may be an apparatus for capturing an MR image of an object by using a multi-echo sequence or an apparatus for processing data obtained by capturing an MR image of an object by using a multi-echo sequence.

For example, the MRI apparatus 300a may be an apparatus for applying an RF pulse using a multi-echo sequence to an object through a plurality of channel coils included in a high frequency multi-coil and reconstructing an MR image by using an MR signal obtained through the plurality of channel coils.

Also, the MRI apparatus 300a may be a server apparatus for providing a multi-echo sequence to be applied to an object and reconstructing an MR image by using an obtained MR signal. The server apparatus may be a medical server apparatus in a hospital or the like in which an MRI process is performed.

Referring to FIG. 3A, the MRI apparatus 300a may include a data obtainer 310 and an image processor 320.

The data obtainer 310 may obtain the first echo data E1 by using an echo generated at the first echo time TE1 and may obtain the second echo data E2 by using an echo generated at the second echo time TE2 that is later than the first echo time TE1. The first echo data E1 and the second echo data E2 may include an overlapping part in a k-space.

According to an exemplary embodiment, the first echo data and the second echo data may be raw data or may be k-space data corresponding to raw data.

The data obtainer 310 may obtain a plurality of pieces of incomplete k-space data respectively corresponding to a plurality of echoes. The term 'incomplete k-space data' refers to k-space data when an MR signal is not sampled at least one point in the k-space and thus is to be reconstructed at the at least one point in the k-space. Non-obtained signals from the 'incomplete k-space data' may be reconstructed by using obtained signals.

The data obtainer 310 according to an exemplary embodiment may obtain additional data about an overlapping part by using an echo generated at a reference echo time of reference echo data.

Reference echo data may refer to echo data including data of a central part of the k-space. Also, the reference echo time may refer to an echo time of an echo generated to obtain the reference echo data.

According to an exemplary embodiment, either one or each of the first echo data and the second echo data may include the data of the central part of the k-space.

The data obtainer 310 according to an exemplary embodiment may determine characteristics of an MR image to be obtained. Also, the data obtainer 310 may determine that the first echo data or the second echo data is to include the data of the central part of the k-space according to the determined characteristics of the MR image. The determining of the characteristics of the MR image may include determining whether, for example, the MR image is a T1-weighted image or a T2 (or T2*)-weighted image.

When the T1-weighted image is to be obtained, the data obtainer 310 may determine a shortest echo time as the reference echo time. In this case, reference echo data may be obtained by using an echo generated at the shortest echo time. For example, when the T1-weighted image is to be obtained, the data obtainer 310 may determine that the first echo data is to include the data of the central part of the k-space. In this case, the reference echo time may be referred to as corresponding to an early echo.

Also, when the T2 or T2*-weighted image is to be obtained, the data obtainer 310 may determine a longest echo time as the reference echo time. In this case, reference echo data may be obtained by using an echo generated at the longest echo time. For example, when the T2 or T2*-weighted image is to be obtained, the data obtainer 310 may determine that the second echo data is to include the data of the central part of the k-space. In this case, the reference echo time may be referred to as corresponding to a late echo.

When the first echo data includes the data of the central part of the k-space and the second echo data does not include the data of the central part of the k-space, the data obtainer 310 may obtain additional data about the overlapping part by using an echo generated at the first echo time.

When the second echo data includes the data of the central part of the k-space and the first echo data does not include the data of the central part of the k-space, the data obtainer 310 may obtain the additional data about the overlapping part by using an echo generated at the second echo time.

According to an exemplary embodiment, a case where the first echo data and the second echo data are k-space data obtained by sampling a magnetic MR signal, which is emitted from an object, in the k-space has been explained. However, the data obtainer 310 may receive only an MR signal from an RF coil and the image processor 320 may perform a sampling process in the k-space.

The image processor 320 may reconstruct an MR image based on the first echo data and the second echo data.

For example, the first echo data and the second echo data may be k-space data, that is, incomplete k-space data, obtained by under-sampling an MR signal. In this case, the incomplete k-space data may be reconstructed based on a map having additional coil information (e.g., a coil sensitivity map) such as a SMASH method or an additional calibration signal such as a GRAPPA method.

Also, the image processor 320 may perform phase correction on either one or both of the first echo data and the second echo data and may reconstruct an MR image by using either one or both of the first echo data and the second echo data on which the phase correction has been performed.

The image processor 320 may perform phase correction based on a phase of data including the data of the central part of the k-space among the first echo data and the second echo data.

For example, when the first echo data is reference echo data, the image processor 320 may perform phase correction on the second echo data based on a phase of the first echo data.

Figure 3B:
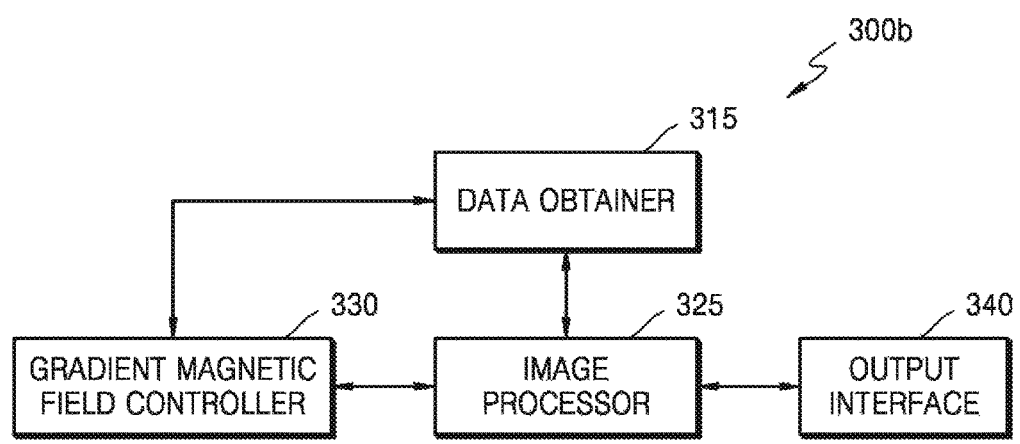
FIG. 3B is a block diagram of an MRI apparatus according to another exemplary embodiment.

FIG. 3B is a block diagram of an MRI apparatus 300b according to another exemplary embodiment.

The MRI apparatus 300b may include a data obtainer 315, an image processor 325, a gradient magnetic field controller 330, and an output interface 340.

The data obtainer 315 and the image processor 325 of FIG. 3B may perform the same functions as those of the data obtainer 310 and the image processor 320 of FIG. 3A, and thus a repeated explanation of the data obtainer 315 and the image processor 325 will not be given.

The data obtainer 315 may obtain the first echo data E1 by using an echo generated at the first echo time TE1 and may obtain the second echo data E2 by using an echo generated at the second echo time TE2 that is later than the first echo time TE1. The first echo data E1 and the second echo data E2 may include an overlapping part in a k-space.

The image processor 325 according to an exemplary embodiment may generate a B0 map by using third echo data and fourth echo data obtained by using echoes generated at a third echo time and a fourth echo time.

According to an exemplary embodiment, the first echo time, the second echo time, the third echo time, and the fourth echo time may be included in one TR of a multi-echo sequence.

Also, the image processor 325 may perform phase correction on either one or both of the first echo data and the second echo data by using the generated B0 map.

The gradient magnetic field controller 330 according to an exemplary embodiment may control a gradient magnetic field to be applied according to the multi-echo sequence.

A first readout gradient magnetic field applied by the gradient magnetic field controller 330 at the first echo time and a second readout gradient magnetic field applied by the gradient magnetic field controller 330 at the second echo time may have the same sign.

Also, a third readout gradient magnetic field applied by the gradient magnetic field controller 330 at the third echo time and a fourth readout gradient magnetic field applied by the gradient magnetic field controller 330 at the fourth echo time may have the same sign.

The output interface 340 may output image data generated by the image processor 325 and a reconstructed MR image to a user. Also, the output interface 340 may output information to be used for the user to manipulate the MRI apparatus 300*b* such as a user interface (UI), user information, or object information.

In detail, the output interface 340 may display a predetermined screen on any of various displays such as a cathode ray tube (CRT) display, a liquid crystal display (LCD), a plasma display panel (PDP) display, an organic light-emitting diode (OLED) display, a field emission display (FED), a light-emitting diode (LED) display, a vacuum fluorescent display (VFD), a digital light processing (DLP) display, a flat panel display (FPD), a 3D display, or a transparent display.

Also, the output interface 340 may display a UI screen for displaying information about an MRI process of the MRI apparatus 300*b*.

For example, the output interface 340 may display a UI screen for designing a multi-echo sequence and a screen for displaying an imaging environment of the MRI apparatus 300*b* and a multi-echo sequence used in the MRI apparatus 300*b*.

Also, the output interface 340 may display images generated in a process of reconstructing an MR image, information about an MRI protocol that is being currently performed, and information about an MRI protocol that is to be subsequently performed.

Also, the output interface 340 may display a screen including a B0 map to which a color is mapped in order for the user to visually recognize the B0 map generated to perform phase correction.

The MRI apparatus 300*b* may further include an input interface, and may determine information to be used to reconstruct an MR image and a multi-echo sequence to be used in an MRI process based on information input through the UI screen.

In detail, the MRI apparatus 300*b* may determine a multi-echo sequence to be used in an MRI process based on information about an echo train length (ETL) input through the UI screen. Also, the MRI apparatus 300*b* may determine reference echo data based on information about reference echo data input through the UI screen.

Also, the MRI apparatus 300*b* may determine a reconstruction method based on information about a method of reconstructing MR data input through the UI screen.

Also, the MRI apparatus 300*b* may determine a type of data used to generate the B0 map based on information input through the UI screen.

Figure 4A:
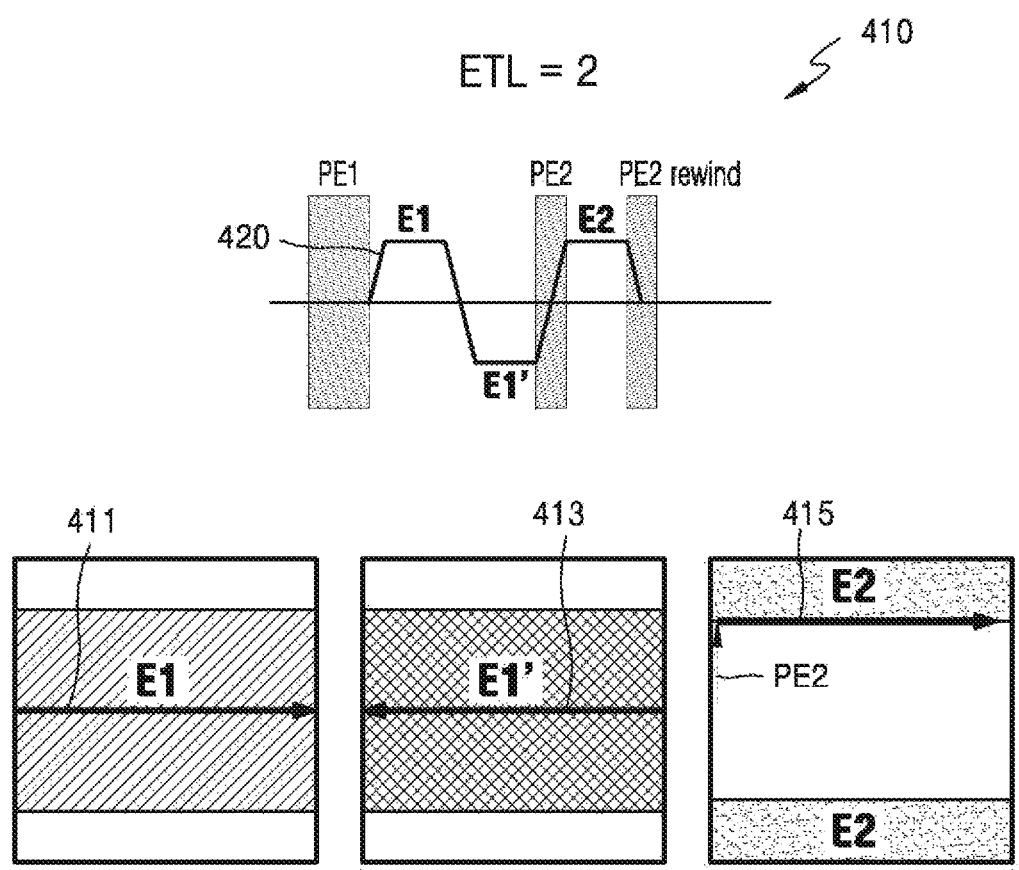
FIG. 4A is a pulse sequence diagram of a pulse sequence with an echo train length (ETL) of 2 applied by the MRI apparatus of FIG. 3A or 3B, according to an exemplary embodiment.

FIG. 4A is a pulse sequence diagram 410 of a pulse sequence with an ETL of 2 applied by the MRI apparatus 300*a* or 300*b*, according to an exemplary embodiment.

Referring to FIG. 4A, the MRI apparatus 300*a* or 300*b* may apply a gradient magnetic field 420 according to a multi-echo sequence shown in the pulse sequence diagram 410.

In detail, the pulse sequence diagram 410 may show gradient magnetic fields PE1, PE2, and PE2 rewind of a phase encoding direction and a gradient magnetic field 420 of a readout direction applied by the MRI apparatus 300*a* or 300*b* according to an exemplary embodiment during one TR. The readout direction may correspond to a kx direction of a k-space and the phase encoding direction may correspond to a ky direction of the k-space.

The pulse sequence diagram 410 may show the multi-echo sequence. The number of echoes used to obtain data in one TR of the multi-echo sequence may be referred to as an ETL. According to the multi-echo sequence of the pulse sequence diagram 410 of FIG. 4A, the MRI apparatus 300*a* and 300*b* reconstructs a final k-space by obtaining the first echo data E1 and the second echo data E2 respectively at the first echo time TE1 and the second echo time TE2. That is, in the pulse sequence diagram 410, an ETL is 2.

The gradient magnetic fields PE1, PE2, and PE2 rewind of the phase encoding direction of FIG. 4A indicate time intervals to which gradient magnetic fields of the phase encoding directions are applied. The gradient magnetic fields PE1, PE2, and PE2 rewind of the phase encoding direction have different strengths according to TRs.

Referring to FIG. 4A, the MRI apparatus 300*a* or 300*b* may apply the gradient magnetic field 420 for generating a plurality of echoes in the readout direction of the k-space, as shown in the pulse sequence diagram 410. The MRI apparatus 300*a* or 300*b* may generate echoes at the first echo time TE1, the second echo time TE2, and third echo time TE1' during one TR by applying the gradient magnetic field 420.

The MRI apparatus 300*a* or 300*b* may determine a position of the first echo data E1 on a ky-axis in the k-space by applying the gradient magnetic field PE of the phase encoding direction before obtaining the first echo data E1.

After the gradient magnetic field PE1 of the phase encoding direction is applied, the MRI apparatus 300*a* or 300*b* may fill one line of data among the first echo data E1 of the k-space in a positive direction 411 by using a readout gradient magnetic field corresponding to the first echo time TE1. The first echo data E1 may be data for reconstructing a final k-space data and may be data used to perform phase correction.

The MRI apparatus 300*a* or 300*b* may fill one line of data among third echo data E1' of the k-space in a negative direction 413 by using a readout gradient magnetic field corresponding to the third echo time TE1' by reversing a sign of the readout gradient magnetic field. According to the exemplary embodiment of FIG. 4A, the third echo data E1' may be data used to perform phase correction, instead of data used to reconstruct the final k-space data. According to another exemplary embodiment, the third echo data E1' may include data used to reconstruct the final k-space data.

The MRI apparatus 300*a* or 300*b* may determine a position of the second echo data E2 on the ky-axis in the k-space by applying the gradient magnetic field PE2 of the phase encoding direction before obtaining the second echo data E2.

Referring to FIG. 4A, when the MRI apparatus 300*a* or 300*b* applies the gradient magnetic field PE2 of the phase encoding direction, a position of data in the k-space may be moved away from the origin of the ky-axis.

The MRI apparatus 300a or 300b may fill one line of data among the second echo data E2 of the k-space in a positive direction 415 by using a readout gradient magnetic field corresponding to the second echo time TE2 by re-reversing a sign of the readout gradient magnetic field. Next, the MRI apparatus 300a or 300b may apply the gradient magnetic field PE2 rewind of the phase encoding direction, which has the same strength and the opposite direction as and to those of the gradient magnetic field PE2 of the phase encoding direction, before entering a next TR. When the MRI apparatus 300a or 300b applies the gradient magnetic field PE2 rewind of the phase encoding direction, data of the k-space to be obtained in the next TR may be placed at the origin of the ky-axis.

Next, in the next TR, the MRI apparatus 300a or 300b may determine a position of the first echo data E1 on the ky-axis in the k-space by applying the gradient magnetic field PE1 of the phase encoding direction.

Referring to FIG. 4A, the MRI apparatus 300a or 300b may obtain the first echo data E1 corresponding to the first echo time TE1, the second echo data E2 corresponding to the second echo time TE2, and the third echo data E1' corresponding to the third echo time TE1' by applying the gradient magnetic field 420 during several TRs.

The directions 411 and 415, in which pieces of data are placed in the k-space when the first echo data E1 and the second echo data E2 are obtained by the MRI apparatus 300a or 300b, are the same. That is, a readout gradient magnetic field applied at the first echo time TE1 and a readout gradient magnetic field applied at the second echo time TE2 have the same sign.

When readout gradient magnetic fields have the same sign, directions in which echo time shifts occur may be the same, and in this case, the MRI apparatus 300a or 300b may reduce an error caused by an echo time shift in a reconstructed final image.

Referring to FIG. 4A, because the MRI apparatus 300a or 300b does not apply a phase encoding gradient magnetic field to obtain the third echo data E1' after obtaining the first echo data E1, positions of the first echo data E1 and the third echo data E1' on the ky-axis in the k-space may be opposite to each other.

The directions 411 and 413, in which pieces of data are placed in the k-space when the MRI apparatus 300a or 300b obtains the first echo data E1 and the third echo data E1', differ from each other. If the MRI apparatus 300a or 300b generates a B0 map by using the first echo data E1 and the third echo data E1', the MRI apparatus 300a or 300b is used to correct an error caused when directions in which echo time shifts occur differ from each other.

As shown in FIG. 4A, the first echo data E1 may include data of a central part of the k-space and the second echo data E2 may not include the data of the central part of the k-space.

Referring to FIG. 4A, when a T1-weighted image is to be obtained, the MRI apparatus 300a or 300b may determine the first echo time TE1 as a reference echo time. In this case, the first echo data E1 that is reference echo data may include an overlapping part in the k-space with the second echo data E2.

Figure 4B:
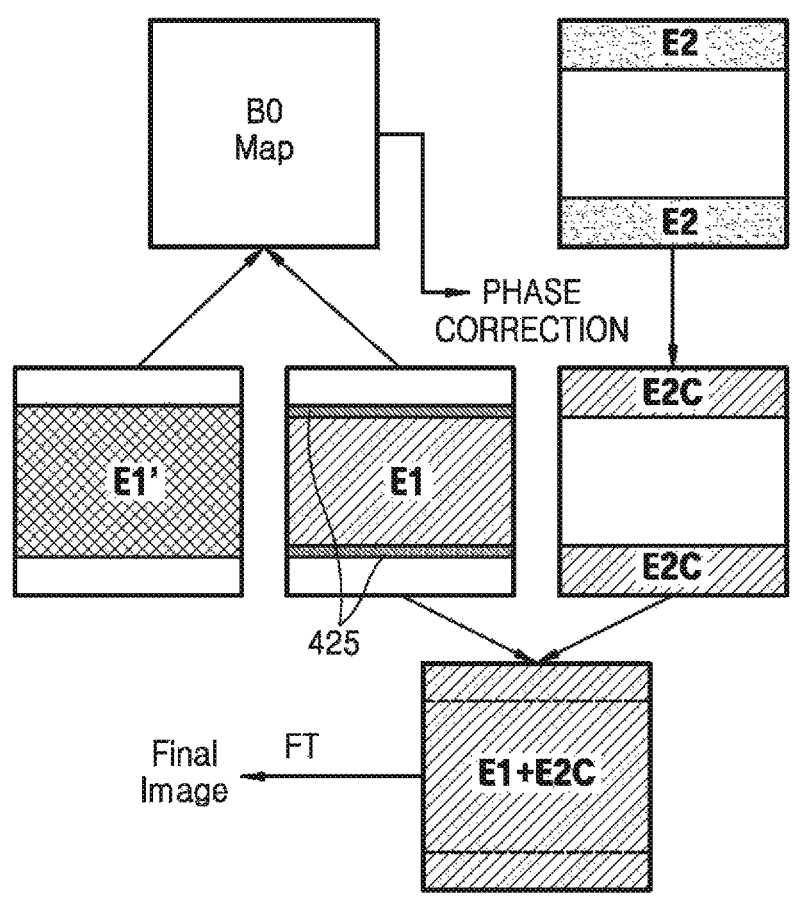
FIG. 4B is a diagram illustrating a process performed by the MRI apparatus of FIG. 3A or 3B to obtain an MR image, according to the pulse sequence diagram of FIG. 4A, according to an exemplary embodiment.

FIG. 4B is a diagram illustrating a process performed by the MRI apparatus 300a or 300b to obtain an MR image, according to the pulse sequence diagram 410 of FIG. 4A, according to an exemplary embodiment.

Referring to FIG. 4B, the MRI apparatus 300a or 300b performs a process of reconstructing a final image based on the first echo data E1 corresponding to the first echo time TE1 and the second echo data E2 corresponding to the second echo time TE2.

Referring to FIG. 4B, the MRI apparatus 300a or 300b according to an exemplary embodiment may obtain the first echo data E1 corresponding to the first echo time TE1 and then may obtain the second echo data E2 corresponding to the second echo time TE2 that is later than the first echo time TE1. Also, the MRI apparatus 300a or 300b may obtain the third echo data E1' corresponding to the third echo time TE1'.

Referring to FIG. 4B, reference echo data may be the first echo data E1 and a reference echo time may be the first echo time TE1. In this case, the first echo data E1 may include an overlapping part in the k-space with the second echo data E2. For example, the first echo data E1 may further include additional data 425 about the overlapping part in the k-space with the second echo data E2. The additional data 425 may account for, for example, about 10% of the entire k-space.

The MRI apparatus 300a or 300b according to an exemplary embodiment may perform phase correction on the second echo data E2. The MRI apparatus 300a or 300b may generate a B0 map by using the first echo data E1 and the third echo data E1' and may perform phase correction by using the generated B0 map.

As described with reference to FIG. 4A, when the directions 411 and 413, in which pieces of data are placed in the k-space when the MRI apparatus 300a or 300b obtains the first echo data E1 and the third echo data E1', differ from each other, the MRI apparatus 300a or 300b is used to correct an error caused when directions in which echo time shifts occur differ from each other, to generate the B0 map.

The MRI apparatus 300a or 300b may perform phase correction on the second echo data E2 and may obtain second echo data E2C whose phase is corrected based on the first echo time TE1. The MRI apparatus 300a or 300b may reduce the effects of blur or aliasing in a final image that may occur as pieces of data obtained at different echo times are used due to the phase correction.

The MRI apparatus 300a or 300b may obtain final k-space data E1+E2C based on the first echo data E1 and the corrected second echo data E2C. If the first echo data E1 and the second echo data E2 are under-sampled k-space data, the final k-space data E1+E2C may be data reconstructed by using a GRAPPA method or a SMASH method.

When the final k-space data E1+E2C is reconstructed, the MRI apparatus 300a or 300b may reconstruct k-space data based on data of the first echo data E1 other than the additional data 425 and the second echo data E2. The MRI apparatus 300a or 300b may use a GRAPPA method or the like to reconstruct the k-space data. Next, the MRI apparatus 300a or 300b may re-reconstruct the k-space data based on the first echo data E1 including the additional data 425 and the corrected second echo data E2C. In this case, a GRAPPA method or the like may be re-applied to the additional data 425, and the MRI apparatus 300a or 300b may obtain the final k-space data E1+E2C.

According to the exemplary embodiment of FIGS. 4A and 4B, the MRI apparatus 300a or 300b may generate a B0 map for performing phase correction and final k-space data by using echo data obtained during one TR. Accordingly, the MRI apparatus 300a or 300b may obtain data to be used for phase correction by using only a pulse sequence for obtaining k-space data without additionally using a pulse sequence for phase correction.

Figure 5A:
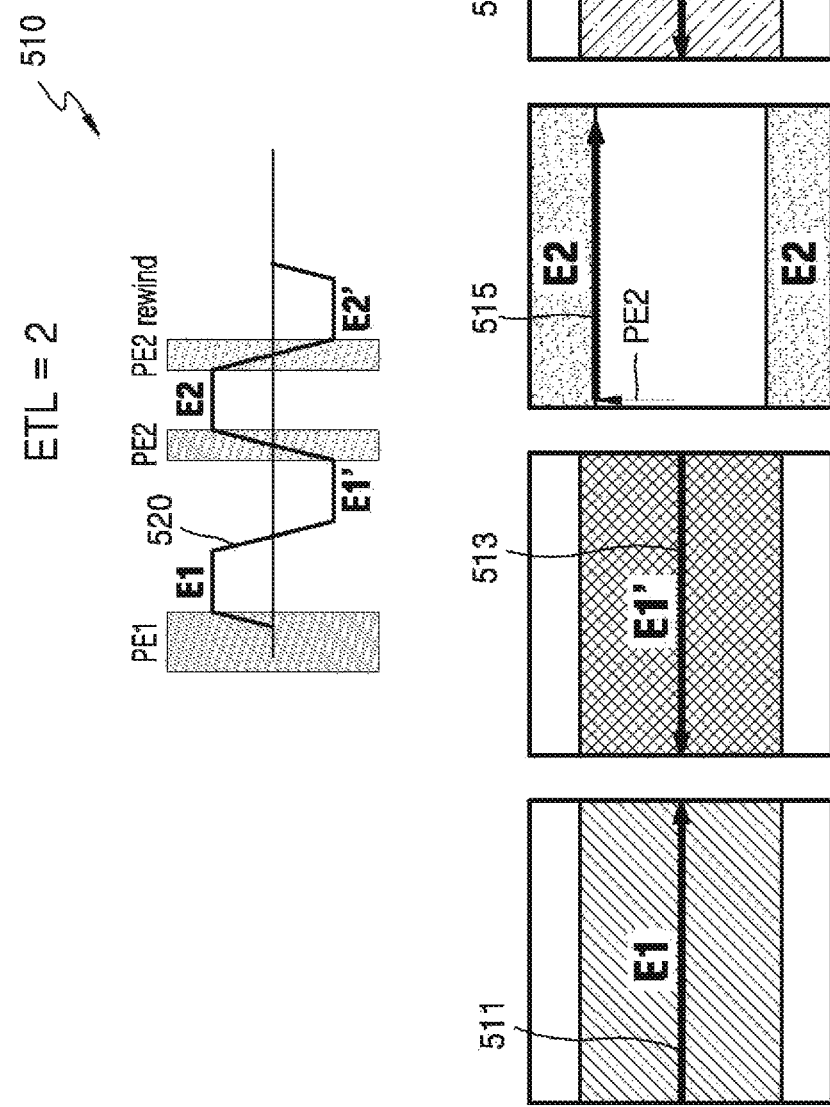
FIG. 5A is a pulse sequence diagram of a pulse sequence with an ETL of 2 applied by the MRI apparatus of FIG. 3A or 3B, according to an exemplary embodiment.

FIG. 5A is a pulse sequence diagram 510 of another pulse sequence with an ETL of 2 applied by the MRI apparatus 300a or 300b, according to an exemplary embodiment.

Referring to FIG. 5A, the MRI apparatus 300a or 300b may apply a gradient magnetic field 520 according to a multi-echo sequence shown in the pulse sequence diagram 510.

Like in FIG. 4A, the pulse sequence diagram 510 may show the gradient magnetic fields PE1, PE2, and PE2 rewind of a phase encoding direction and a gradient magnetic field 520 of a readout direction applied by the MRI apparatus 300a or 300b according to an exemplary embodiment during one TR.

Referring to FIG. 5A, the MRI apparatus 300a or 300b may apply the gradient magnetic field 520 for generating a plurality of echoes in the readout direction of a k-space as shown in the pulse sequence diagram 510.

The MRI apparatus 300a or 300b may generate echoes at the first echo time TE1, the second echo time TE2, the third echo time TE1' and a fourth echo time TE2' during one TR by applying the gradient magnetic field 520. That is, the pulse sequence diagram 510 of FIG. 5A is different from the pulse sequence diagram 410 of FIG. 4A in that an echo corresponding to the fourth echo time TE2' may be additionally generated.

The MRI apparatus 300a or 300b may obtain the first echo data E1 and the second echo data E2 by using echoes generated at the first echo time TE1 and the second echo time TE2 included in one TR. The MRI apparatus 300a or 300b reconstructs a final k-space by obtaining the first echo data E1 and the second echo data E2.

According to the exemplary embodiment of FIG. 5A, the third echo data E1' and fourth echo data E2' may be data used for phase correction, instead of data used to reconstruct final k-space data. According to another exemplary embodiment, the third echo data E1' and the fourth echo data E2' may include data used to reconstruct the final k-space data.

First, the MRI apparatus 300a or 300b may determine a position of the first echo data E1 on a ky-axis in the k-space by applying the gradient magnetic field PE1 of the phase encoding direction before obtaining the first echo data E1.

After the gradient magnetic field PE1 of the phase encoding direction is applied, the MRI apparatus 300a or 300b may fill one line of data among the first echo data E1 of the k-space in a positive direction 511 by using a readout gradient magnetic field corresponding to the first echo time TE1.

The MRI apparatus 300a or 300b may fill one line of data among the third echo data E1' of the k-space in a negative direction 513 by using a readout gradient magnetic field corresponding to the third echo time TE1' by reversing a sign of the readout gradient magnetic field.

The MRI apparatus 300a or 300b may determine a position of the second echo data E2 on the ky-axis in the k-space by applying the gradient magnetic field PE2 of the phase encoding direction before obtaining the second echo data E2.

The MRI apparatus 300a or 300b may fill one line of data among the second echo data E2 of the k-space in a positive direction 515 by using a readout gradient magnetic field corresponding to the second echo time TE2 by re-reversing a sign of the readout gradient magnetic field.

Next, the MRI apparatus 300a or 300b may apply the gradient magnetic field PE2 rewind of the phase encoding direction that has the same strength and the opposite direction as and to those of the gradient magnetic field PE2 of the phase encoding direction. Next, the MRI apparatus 300a or 300b may fill one line of data among the fourth echo data E2' of the k-space in a negative direction 517 by using a readout gradient magnetic field corresponding to the fourth echo time TE2' by re-reversing a sign of the readout gradient magnetic field.

When the MRI apparatus 300a or 300b applies the gradient magnetic field PE2 rewind of the phase encoding direction, data in the k-space of a next TR may be placed at the origin of the ky-axis.

Next, in the next TR, the MRI apparatus 300a or 300b may determine a position of the echo data E1 on the ky-axis in the k-space by applying the gradient magnetic field PE1 of the phase encoding direction.

Referring to FIG. 5A, the MRI apparatus 300a or 300b may obtain the first echo data E1 corresponding to the first echo time TE1, the second echo data E2 corresponding to the second echo time TE2, the third echo data E1' corresponding to the third echo time TE1', and the fourth echo data E2' corresponding to the fourth echo time TE2' by applying the gradient magnetic field 520 during several TRs.

Referring to FIG. 5A, positions of the third echo data E1' and the fourth echo data E2' on the ky-axis in the k-space may be opposite to each other. Positions of the first echo data E1 and the third echo data E1' on the ky-axis may differ from each other.

The directions 513 and 517, in which pieces of data are placed in the k-space when the MRI apparatus 300a or 300b obtains the third echo data E1' and the fourth echo data E2', are the same. If the MRI apparatus 300a or 300b generates a B0 map by using the third echo data E1' and the fourth echo data E2', the MRI apparatus 300a or 300b may minimize an error caused when directions in which echo time shifts occur differ from each other.

As shown in FIG. 5A, the first echo data E1 may include data of a central part of the k-space and the second echo data E2 may not include the data of the central part of the k-space.

Referring to FIG. 5A, when a T1-weighted image is to be obtained, the MRI apparatus 300a or 300b may determine the first echo time TE1 as a reference echo time. In this case, the first echo data E1 that is reference echo data may include an overlapping part in the k-space with the second echo data E2.

Figure 5B:
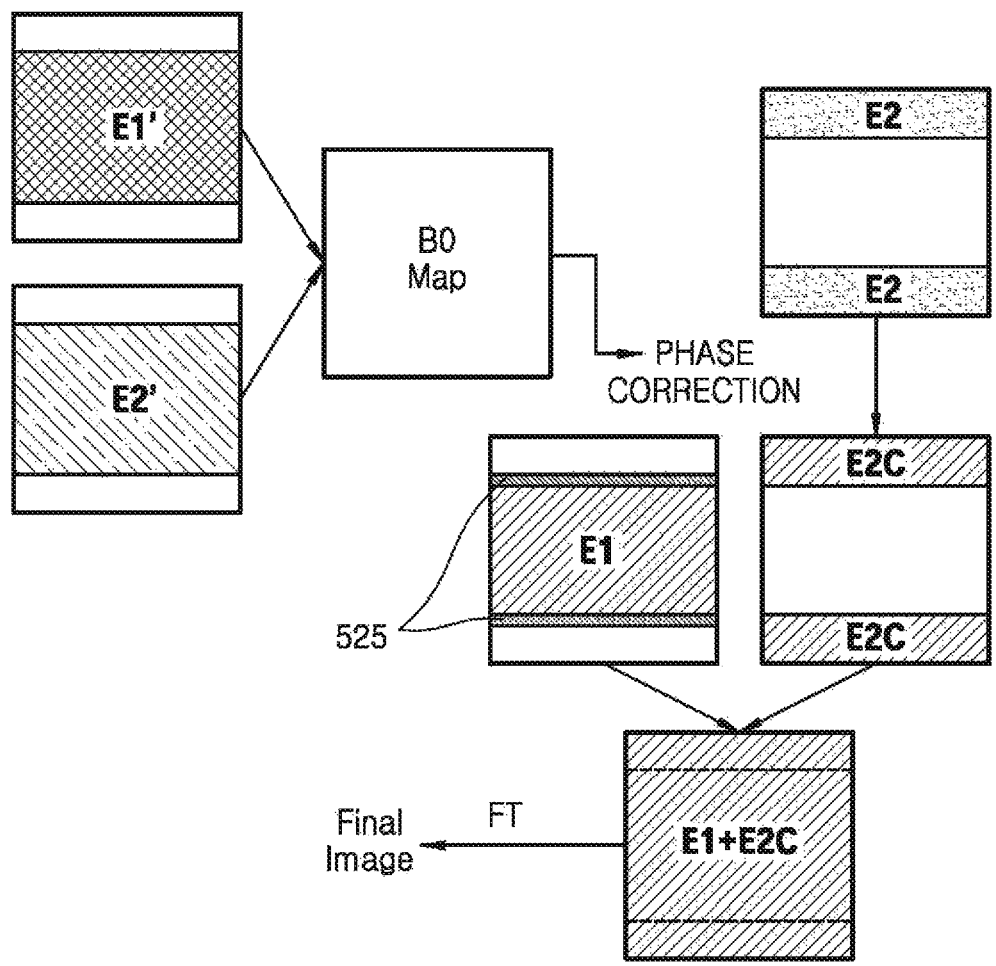
FIG. 5B is a diagram illustrating a process performed by the MRI apparatus of FIG. 3A or 3B to obtain an MR image, according to the pulse sequence diagram of FIG. 5A, according to an exemplary embodiment.

FIG. 5B is a diagram illustrating a process performed by the MRI apparatus 300a or 300b to obtain an MR image, according to the pulse sequence diagram 510 of FIG. 5A, according to an exemplary embodiment.

Referring to FIG. 5B, the MRI apparatus 300a or 300b performs a process of reconstructing a final image based on the first echo data E1 corresponding to the first echo time TE1 and the second echo data E2 corresponding to the second echo time TE2.

The MRI apparatus 300a or 300b according to an exemplary embodiment may obtain the first echo data E1 corresponding to the first echo time TE1 and may obtain the second echo data E2 corresponding to the second echo time TE2 that is later than the first echo time. Also, the MRI apparatus 300a or 300b may obtain the third echo data E1' corresponding to the third echo time TE1' and the fourth echo data E2' corresponding to the fourth echo time TE2' to perform phase correction.

Referring to FIG. 5B, reference echo data may be the first echo data E1 and a reference echo time may be the first echo time TE1. In this case, the first echo data E1 may include an overlapping part in the k-space with the second echo data E2. For example, the first echo data E1 may further include additional data 525 about an overlapping part in a k-space with the second echo data E2. The additional data 525 may account for, for example, about 10% of the entire k-space.

The MRI apparatus 300*a* or 300*b* according to an exemplary embodiment may perform phase correction on the second echo data E2. As described with reference to FIG. 5A, because the directions 513 and 517, in which pieces of data are placed in the k-space when the MRI apparatus 300*a* or 300*b* obtains the third echo data E1' and the fourth echo data E2', are the same, the MRI apparatus 300*a* or 300*b* may minimize an error caused by an echo time shift.

The MRI apparatus 300*a* or 300*b* may perform phase correction on the second echo data E2 and may obtain the second echo data E2C whose phase is corrected based on the first echo time TE1. The phase correction may be performed by using a B0 map generated by using the third echo data E1' and the fourth echo data E2'.

The MRI apparatus 300*a* or 300*b* may obtain the final k-space data E1+E2C based on the first echo data E1 and the corrected second echo data E2C. The final k-space data E1+E2C may be k-space data reconstructed in the k-space. When the final k-space data E1+E2C is reconstructed, k-space data may be first reconstructed based on data of the first echo data E1 other than the additional data 525 and the second echo data E2. The MRI apparatus 300*a* or 300*b* may use a GRAPPA method or the like to reconstruct the k-space data. Next, the MRI apparatus 300*a* or 300*b* may re-reconstruct the k-space data based on the first echo data E1 including the additional data 525 and the corrected second echo data E2C. In this case, a GRAPPA method or the like may be re-applied to the additional data 525, and the MRI apparatus 300*a* or 300*b* may obtain the final k-space data E1+E2C.

According to the exemplary embodiment of FIGS. 5A and 5B, the MRI apparatus 300*a* or 300*b* may obtain the k-space data by using the first echo data E1 and the second echo data E2 obtained by applying gradient magnetic fields having the same sign. Likewise, the MRI apparatus 300*a* or 300*b* may generate a B0 map by using the third echo data E1' and the fourth echo data E2' obtained by applying gradient magnetic fields having the same sign. Accordingly, the MRI apparatus 300*a* or 300*b* may minimize an error of an echo time.

Also, according to the exemplary embodiment of FIGS. 5A and 5B, the MRI apparatus 300*a* or 300*b* may generate a B0 map for performing phase correction and final k-space data by using echo data obtained during one TR. Accordingly, the MRI apparatus 300*a* or 300*b* may obtain data to be used for phase correction by using only a pulse sequence for obtaining k-space data without additionally using a pulse sequence for phase correction.

Figure 6A:
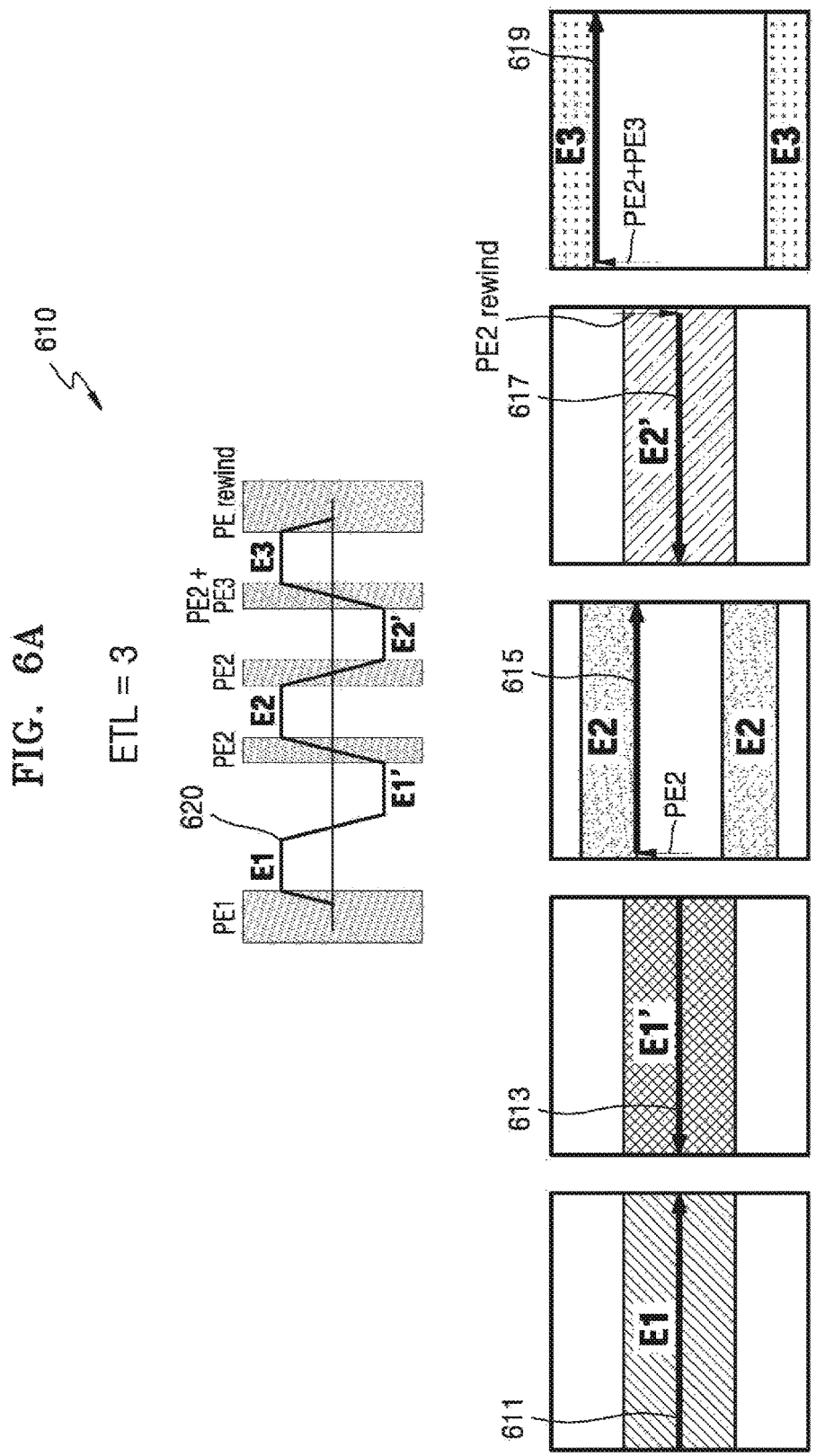
FIG. 6A is a pulse sequence diagram of a pulse sequence with an ETL of 3 applied by the MRI apparatus of FIG. 3A or 3B, according to an exemplary embodiment.

FIG. 6A is a pulse sequence diagram 610 of a pulse sequence with an ETL of 3 applied by the MRI apparatus 300*a* or 300*b*, according to an exemplary embodiment.

Referring to FIG. 6A, the MRI apparatus 300*a* or 300*b* may apply a gradient magnetic field 620 according to a multi-echo sequence shown in the pulse sequence diagram 610.

The pulse sequence diagram 610 may show gradient magnetic fields PE1, PE2, PE2 rewind, PE2+PE3, and PE rewind of a phase encoding direction and the gradient magnetic field 620 of a readout direction applied by the MRI apparatus 300*a* or 300*b* according to an exemplary embodiment during one TR.

Referring to FIG. 6A, the MRI apparatus 300*a* or 300*b* may apply the gradient magnetic field 620 for generating a plurality of echoes in the readout direction of a k-space as shown in the pulse sequence diagram 610.

The MRI apparatus 300*a* or 300*b* may generate echoes at the first echo time TE1, the second echo time TE2, the third echo time TE1', the fourth echo time TE2', and a fifth echo time TE3 during one TR by applying the gradient magnetic field 620. That is, the pulse sequence diagram 610 of FIG. 6A is different from the pulse sequence diagram 510 of FIG. 5A in that an echo corresponding to the fifth echo time TE3 may be additionally generated.

The MRI apparatus 300*a* or 300*b* may obtain the first echo data E1, the second echo data E2, and fifth echo data E3 by using echoes generated at the first echo time TE1, the second echo time TE2, and the fifth echo time TE3 included in one TR. The MRI apparatus 300*a* or 300*b* reconstructs a final k-space by obtaining the first echo data E1, the second echo data E2, and the fifth echo data E3.

According to the exemplary embodiment of FIG. 6A, the third echo data E1' and the fourth echo data E2' may be data used for phase correction, instead of data used to reconstruct final k-space data. According to another exemplary embodiment, the third echo data E1' and the fourth echo data E2' may include data used to reconstruct the final k-space data.

First, the MRI apparatus 300*a* or 300*b* may determine a position of the first echo data E1 on a ky-axis in the k-space by applying the gradient magnetic field PE1 of the phase encoding direction before obtaining the first echo data E1.

After the gradient magnetic field PE1 of the phase encoding direction is applied, the MRI apparatus 300*a* or 300*b* may fill one line of data among the first echo data E1 of the k-space in a positive direction 611 by using a readout gradient magnetic field corresponding to the first echo time TE1.

The MRI apparatus 300*a* or 300*b* may fill one line of data among the third echo data E1' of the k-space in a negative direction 613 by using a readout gradient magnetic field corresponding to the third echo time TE1' by reversing a sign of the readout gradient magnetic field.

The MRI apparatus 300*a* or 300*b* may determine a position of the second echo data E2 on the ky-axis in the k-space by applying the gradient magnetic field PE2 of the phase encoding direction before obtaining the second echo data E2.

The MRI apparatus 300*a* or 300*b* may fill one line of data among the second echo data E2 of the k-space in a positive direction 615 by using a readout gradient magnetic field corresponding to the second echo time TE2 by re-reversing a sign of the readout gradient magnetic field.

Next, the MRI apparatus 300*a* or 300*b* may apply the gradient magnetic field PE2 rewind of the phase encoding direction that has the same strength and the opposite direction as and to those of the gradient magnetic field PE2 of the phase encoding direction. Next, the MRI apparatus 300*a* or 30*b* may fill one line of data among the fourth echo data E2' of the k-space in a negative direction 617 by using a readout gradient magnetic field corresponding to the fourth echo time TE2' by re-reversing a sign of the readout gradient magnetic field.

The MRI apparatus 300*a* or 300*b* may determine a position of the fifth echo data E3 on the ky-axis in the k-space by applying the gradient magnetic field PE2+PE3 of the phase encoding direction.

The MRI apparatus 300*a* or 300*b* may fill one line of data among the fifth echo data e3 of the k-space in a positive direction 619 by using a readout gradient magnetic field corresponding to the fifth echo time TE3 by re-reversing a sign of the readout gradient magnetic field.

Referring to FIG. 6A, the MRI apparatus 300*a* or 300*b* may obtain the first echo data E1 corresponding to the first echo time TE1, the second echo data E2 corresponding to the second echo time TE2, the third echo data E1' corresponding to the third echo time TE1', the fourth echo data E2' corresponding to the fourth echo time TE2', and the fifth echo data E3 corresponding to the fifth echo time TE3 by applying the gradient magnetic field 620 during several TRs.

The directions 611, 615, and 619, in which pieces of data are placed in the k-space when the MRI apparatus 300a or 300b obtains the first echo data E1, the second echo data E2, and the fifth echo data E3, are the same. That is, a readout gradient magnetic field applied at the first echo time TE1, a readout gradient magnetic field applied at the second echo time TE2, and a readout gradient magnetic field applied at the fifth echo time TE3 have the same sign.

Referring to FIG. 6A, positions of the third echo data E1' and the fourth echo data E2' on the ky-axis in the k-space may be opposite to each other. Positions of the first echo data E1 and the third echo data E1' on the ky-axis may differ from each other.

The directions 613 and 617, in which pieces of data are placed in the k-space when the MRI apparatus 300a or 300b obtains the third echo data E1' and the fourth echo data E2', are the same. If the MRI apparatus 300a or 300b generates a B0 map by using the third echo data E1' and the fourth echo data E2', an error caused when directions of echo time shifts differ from each other may be minimized.

As shown in FIG. 6A, the first echo data E1 may include data of a central part of the k-space and the second echo data E2 and the fifth echo data E3 may not include the data of the central part of the k-space.

Referring to FIG. 6A, when a T1-weighted image is to be obtained, the MRI apparatus 300a or 300b may determine the first echo time TE1 as a reference echo time. In this case, the first echo data E1 that is reference echo data may include an overlapping part in the k-space with the second echo data E2. Also, the second echo data E2 may include an overlapping part in the k-space with the fifth echo data E3.

Figure 6B:
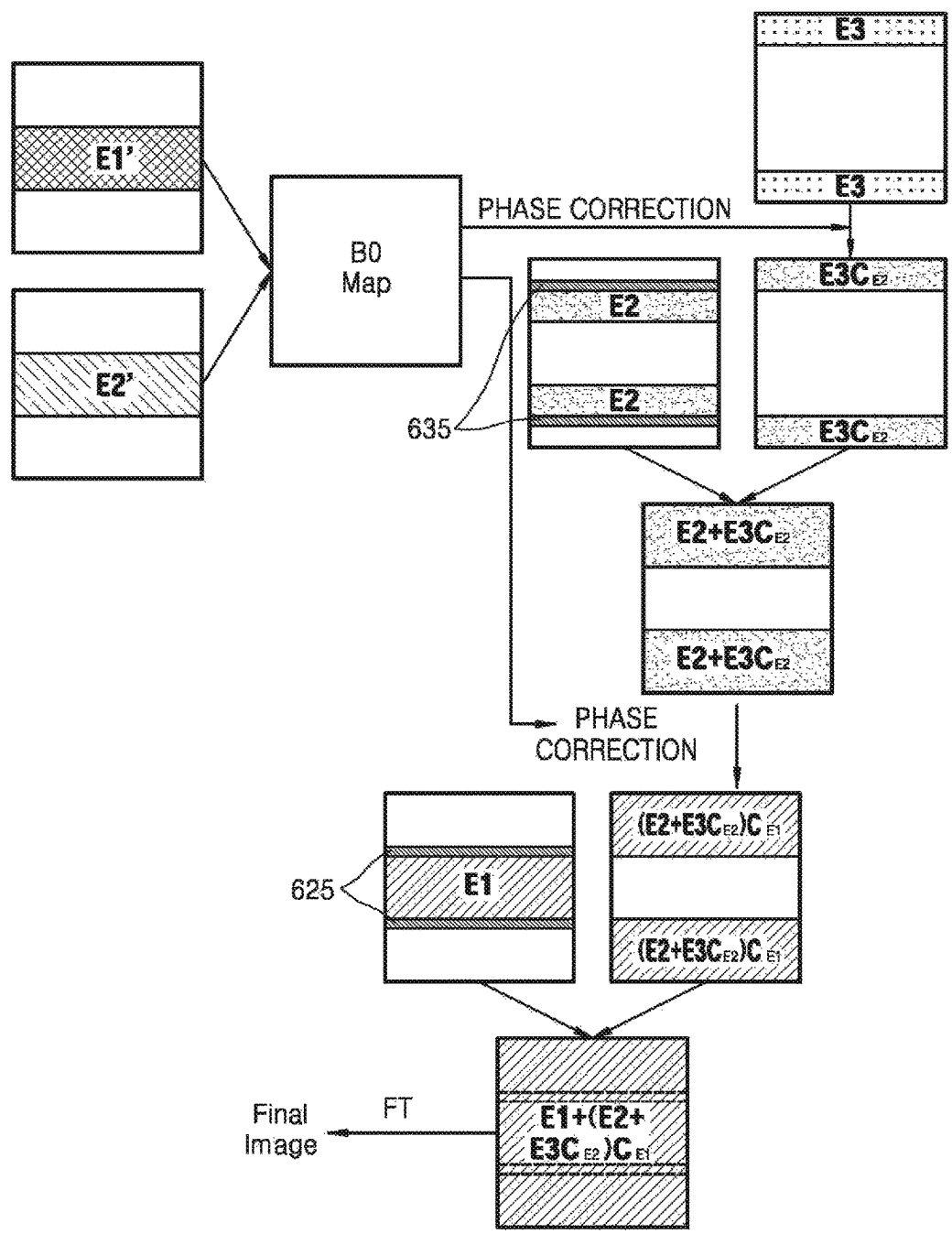
FIG. 6B is a diagram illustrating a process performed by the MRI apparatus of FIG. 3A or 3B to obtain an MR image, according to the pulse sequence diagram of FIG. 6A, according to an exemplary embodiment.

FIG. 6B is a diagram illustrating a process performed by the MRI apparatus 300a or 300b to obtain an MR image, according to the pulse sequence diagram 610 of FIG. 6A, according to an exemplary embodiment.

Referring to FIG. 6B, the MRI apparatus 300a or 300b performs a process of reconstructing a final image based on the first echo data E1 corresponding to the first echo time TE1, the second echo data E2 corresponding to the second echo time TE2, and the fifth echo data E3 corresponding to the fifth echo time TE3.

The MRI apparatus 300a or 300b according to an exemplary embodiment may obtain the first echo data E1 corresponding to the first echo time TE1, may obtain the second echo data E2 corresponding to the second echo time TE2 that is later than the first echo time TE1, and may obtain the fifth echo data E3 corresponding to the fifth echo time TE3 that is later than the second echo time TE2. Also, the MRI apparatus 300a or 300b may obtain the third echo data E1' corresponding to the third echo time TE1' and the fourth echo data E2' corresponding to the fourth echo time TE2' to perform phase correction.

Referring to FIG. 6B, reference echo data may be the first echo data E1 and a reference echo time may be the first echo time TE1. In this case, the first echo data E1 may further include additional data 625 about the overlapping part in the k-space with the second echo data E2. Also, the second echo data E2 may further include additional data 635 about the overlapping part in the k-space with the third echo data E3.

First, the MRI apparatus 300a or 300b according to an exemplary embodiment may perform phase correction on the fifth echo data E3. As described with reference to FIG. 6A, because the directions 613 and 617, in which pieces of data are placed in the k-space when the MRI apparatus 300a or 300b obtains the third echo data E1' and the fourth echo data E2' used for phase correction, are the same, an error caused by an echo time shift may be minimized.

The MRI apparatus 300a or 300b may perform phase correction on the fifth echo data E3 and may obtain fifth echo data $E3C_{E2}$ whose phase is corrected based on the second echo time TE2. The phase correction may be performed by using a B0 map generated by using the third echo data E1' and the fourth echo data E2'.

The MRI apparatus 300a or 300b performs first phase correction on the fifth echo data E3 and then performs second phase correction on intermediate k-space data $E2+E3C_{E2}$ obtained based on the second echo data E2 and the corrected fifth echo data $E3C_{E2}$. The first phase correction may be performed based on a phase of the second echo data E2 and the second phase correction may be performed based on a phase of the first echo data E1.

The MRI apparatus 300a or 300b may obtain the intermediate k-space data $E2+E3C_{E2}$ based on the second echo data E2 and the corrected fifth echo data $E3C_{E2}$. If the second echo data E2 and the fifth echo data E3 are under-sampled k-space data, the intermediate k-space data $E2+E3C_{E2}$ may be data reconstructed by using a GRAPPA method or a SMASH method.

Also, when the intermediate k-space data $E2+E3C_{E2}$ is reconstructed, the MRI apparatus 300a or 300b may reconstruct k-space data based on data of the second echo data E2 other than the additional data 635 and the fifth echo data E3. The MRI apparatus 300a or 300b may use a GRAPPA method or the like to reconstruct the k-space data. Next, the MRI apparatus 300a or 300b may re-reconstruct the k-space data based on the second echo data E2 including the additional data 635 and the corrected fifth echo data $E3C_{E2}$. In this case, a GRAPPA method or the like may be re-applied to the additional data 635, and the MRI apparatus 300a or 300b may obtain the intermediate k-space data $E2+E3C_{E2}$.

Next, the MRI apparatus 300a or 300b may perform second phase correction on the intermediate k-space data $E2+E3C_{E2}$ obtained based on the second echo data E2 and the corrected fifth echo data $E3C_{E2}$.

The MRI apparatus 300a or 300b may perform phase correction on the intermediate k-space data $E2+E3C_{E2}$ and may obtain intermediate k-space data $(E2+E3C_{E2})C_{E1}$ whose phase is corrected based on the first echo time TE1. The phase correction may be performed by using a B0 map generated by using the third echo data E1' and the fourth echo data E2'.

The MRI apparatus 300a or 300b may obtain final k-space data $E1+(E2+E3C_{E2})C_{E1}$ based on the first echo data E1 and the corrected intermediate k-space data $(E2+E3C_{E2})C_{E1}$. The final k-space data $E1+(E2+E3C_{E2})C_{E1}$ may be k-space data reconstructed in the k-space.

A method performed by the MRI apparatus 300a or 300b to reconstruct the final k-space data $E1+(E2+E3C_{E2})C_{E1}$ by using the additional data 625 is similar to that described with reference to FIG. 5B, and thus a detailed explanation thereof will not be given.

According to the exemplary embodiment of FIGS. 6A and 6B, the MRI apparatus may obtain k-space data by using the first echo data E1, the second echo data E2, and the fifth echo data E3 obtained by applying gradient magnetic fields having the same sign. Likewise, the MRI apparatus 300a or 300b may generate a B0 map by using the third echo data E1' and the fourth echo data E2' obtained by applying gradient magnetic fields having the same sign. Accordingly, the MRI apparatus 300a or 300b may minimize an error of an echo time.

Also, according to the exemplary embodiment of FIGS. 6A and 6B, the MRI apparatus 300a or 300b may generate a B0 map for performing phase correction and final k-space data by using echo data obtained during one TR. Accordingly, the MRI apparatus 300a or 300b may obtain data to be used for phase correction by using only a pulse sequence for obtaining k-space data without additionally using a pulse sequence for phase correction.

According to the exemplary embodiments of FIGS. 4A through 6B, when a reference echo time is determined to correspond to an early echo, the MRI apparatus 300a or 300b may determine the first echo data as reference echo data.

A case where a reference echo time corresponds to a late echo will now be explained with reference to FIGS. 7A through 8B.

Figure 7A:
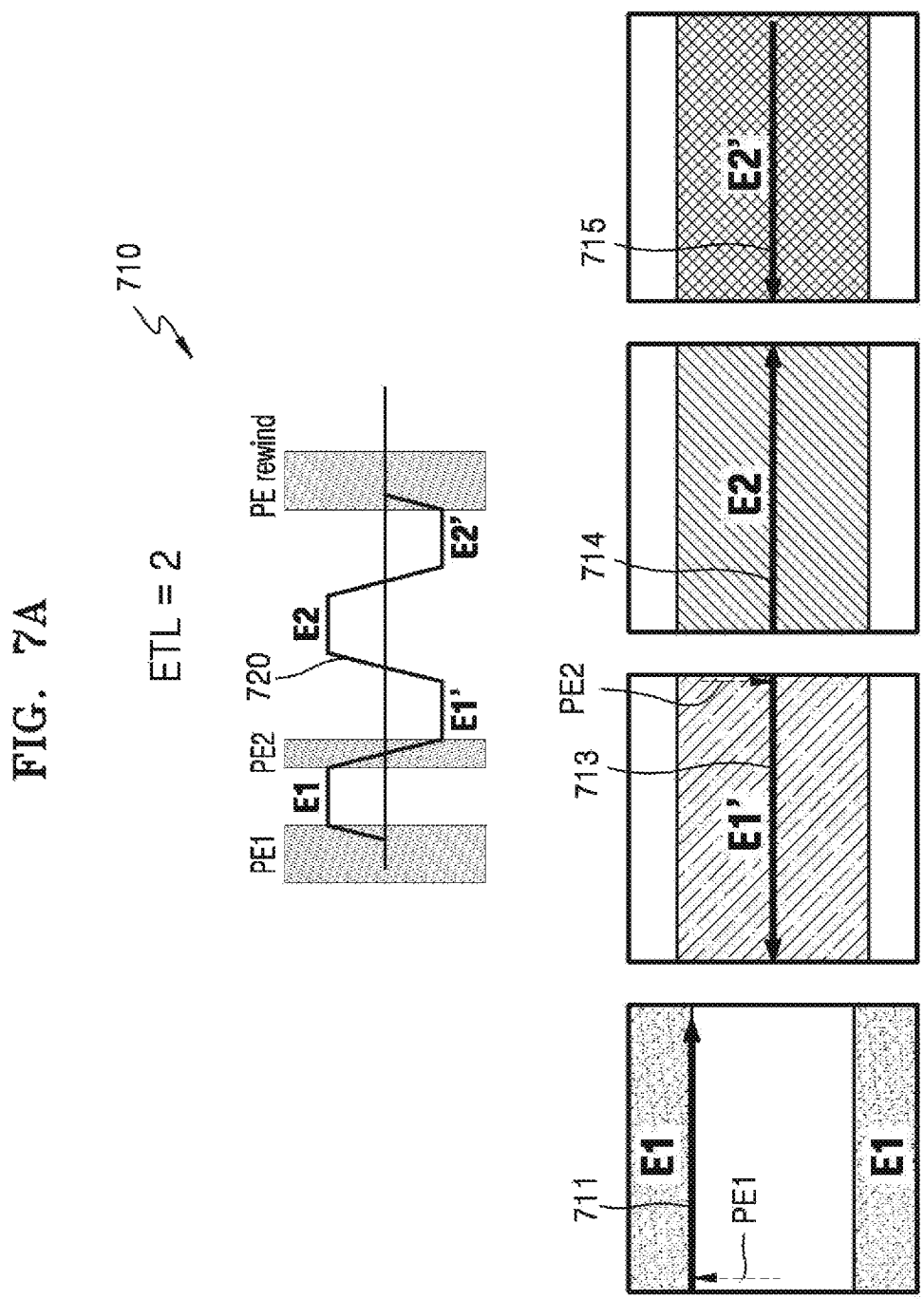
FIG. 7A is a pulse sequence diagram of a pulse sequence with an ETL of 2 applied by the MRI apparatus of FIG. 3A or 3B, according to an exemplary embodiment.

FIG. 7A is a pulse sequence diagram 710 of a pulse sequence with an ETL of 2 applied by the MRI apparatus 300a or 300b, according to an exemplary embodiment.

Referring to FIG. 7A, the MRI apparatus 300a or 300b may apply a gradient magnetic field 720 according to a multi-echo sequence shown in the pulse sequence diagram 710.

In detail, the pulse sequence diagram 710 may show the gradient magnetic fields PE1, PE2, and PE rewind of a phase encoding direction and a gradient magnetic field 720 of a readout direction applied by the MRI apparatus 300a or 300b according to an exemplary embodiment during one TR.

When the pulse sequence diagram 710 of FIG. 7A and the pulse sequence diagram 510 of FIG. 5A are compared to each other, the gradient magnetic field 720 of the readout direction may be the same as the gradient magnetic field 520 of the readout direction in the pulse sequence diagram 510. The pulse sequence diagram 710 is different from the pulse sequence diagram 510 of FIG. 5A in the gradient magnetic fields PE1, PE2, and PE rewind of the phase encoding direction, and thus the following will focus on the difference.

The MRI apparatus 300a or 300b may determine a position of the first echo data E1 on a ky-axis in a k-space by applying the gradient magnetic field PE1 of the phase encoding direction before obtaining the first echo data E1.

After the gradient magnetic field PE1 of the phase encoding direction is applied, the MRI apparatus 300a or 300b may fill one line of data among the first echo data E1 of the k-space in a positive direction 711 by using a readout gradient magnetic field corresponding to the first echo time TE1. The first echo data E1 may not include data whose ky-coordinate in the k-space is 0.

The MRI apparatus 300a or 300b may determine a position of the third echo data E1' on the ky-axis in the k-space by applying the gradient magnetic field PE2 of the phase encoding direction before obtaining the third echo data E1'.

The MRI apparatus 300a or 300b may fill one line of data among the third echo data E1' of the k-space in a negative direction 713 by using a readout gradient magnetic field corresponding to the third echo time TE1' by reversing a sign of the readout gradient magnetic field.

The MRI apparatus 300a or 300b may fill one line of data among the second echo data E2 of the k-space in a positive direction 714 by using a readout gradient magnetic field corresponding to the second echo time TE2 by re-reversing a sign of the readout gradient magnetic field.

Next, the MRI apparatus 300a or 300b may fill one line of data among the fourth echo data E2' of the k-space in a negative direction 715 by using a readout gradient magnetic field corresponding to the fourth echo time TE2' by re-reversing a sign of the readout gradient magnetic field.

Next, the MRI apparatus 300a or 300b may apply the gradient magnetic field PE rewind of the phase encoding direction. When the MRI apparatus 300a or 300b applies the gradient magnetic field PE rewind of the phase encoding direction, data of the k-space in a next TR may be placed at a position whose ky-coordinate is 0.

As shown in FIG. 7A, the MRI apparatus 300a or 300b may obtain the first echo data E1 not including data of a central part of the k-space at the first echo time TE1 and may obtain the second echo data E2 including the data of the central part of the k-space at the second echo time TE2.

Referring to FIG. 7A, when a T2 or T2*-weighted image is to be obtained, the MRI apparatus 300a or 300b may determine the second echo time TE2 as a reference echo time. In this case, the second echo data E2 that is reference echo data may include an overlapping part in the k-space with the first echo data E1.

Figure 7B:
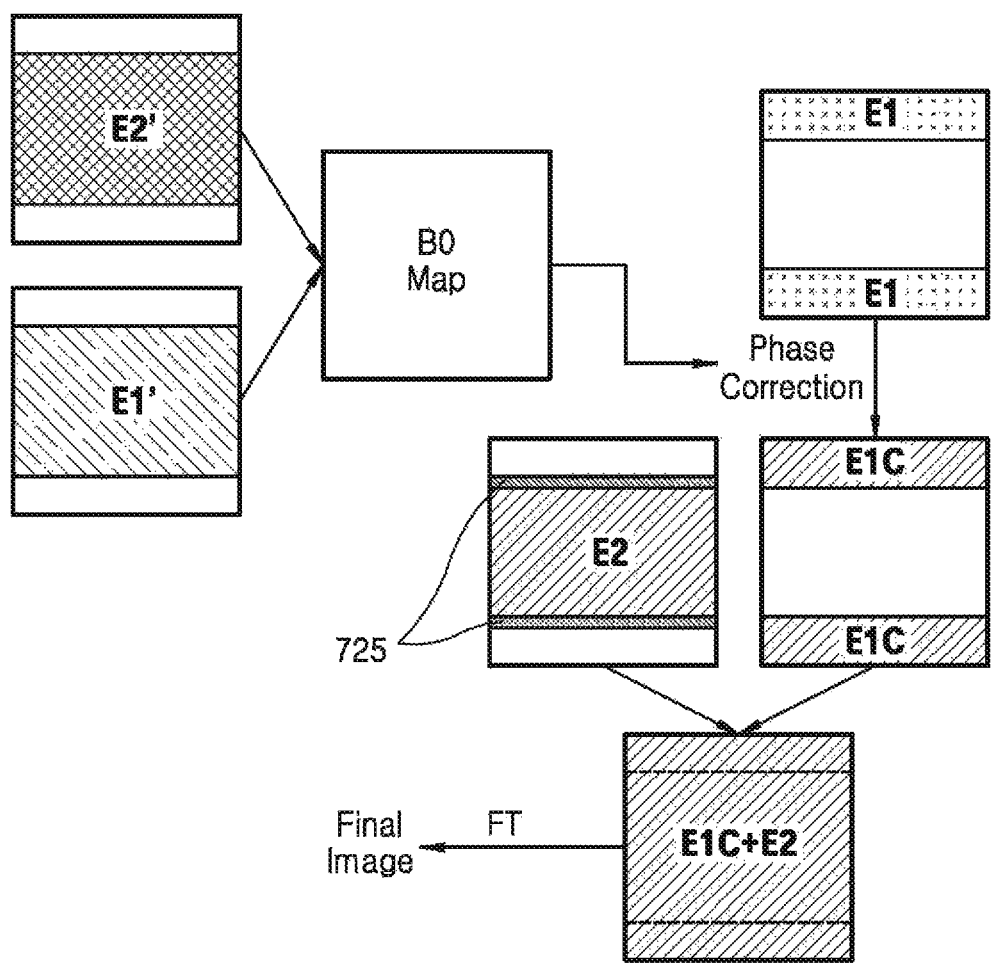
FIG. 7B is a diagram illustrating a process performed by the MRI apparatus of FIG. 3A or 3B to obtain an MR image, according to the pulse sequence diagram of FIG. 7A, according to an exemplary embodiment.

FIG. 7B is a diagram illustrating a process performed by the MRI apparatus 300a or 300b to obtain an MR image, according to the pulse sequence diagram 710 of FIG. 7A, according to an exemplary embodiment.

Referring to FIG. 7B, the MRI apparatus 300a or 300b performs a process of reconstructing a final image based on the first echo data E1 corresponding to the first echo time TE1 and the second echo data E2 corresponding to the second echo time TE2.

The MRI apparatus 300a or 300b according to an exemplary embodiment may obtain the first echo data E1 corresponding to the first echo time TE1 and then may obtain the second echo data E2 corresponding to the second echo time TE2 that is later than the first echo time TE1. Also, the MRI apparatus 300a or 300b may obtain the third echo data E1' corresponding to the third echo time TE1' and the fourth echo data E2' corresponding to the fourth echo time TE2'.

Referring to FIG. 7B, reference echo data may be the second echo data E2 and a reference echo time may be the second echo time TE2. When FIG. 7B and FIG. 5B are compared with each other, there is a difference in reference echo data and a reference echo time and others in FIGS. 7B and 5B may be the same. Accordingly, the following will focus on the difference.

Referring to FIG. 7B, reference echo data may be the second echo data E2, and in this case, the second echo data E2 may include an overlapping part in a k-space with the first echo data E1. For example, the second echo data E2 may further include additional data 725 about the overlapping part in the k-space with the first echo data E1. The additional data 725 may account for, for example, about 10% of the entire k-space.

The MRI apparatus 300a or 300b according to an exemplary embodiment may perform phase correction on the first echo data E1. Because the directions 713 and 715 (see FIG. 7A), in which pieces of data are placed in the k-space when the MRI apparatus 300a or 300b obtains the third echo data E1' and the fourth echo data E2', are the same, an error caused by an echo time shift may be minimized.

The MRI apparatus 300a or 300b may perform phase correction on the first echo data E1 and may obtain first echo data E1C whose phase is corrected based on the second echo time TE2. The phase correction may be performed by using a B0 map generated by using the third echo data E1' and the fourth echo data E2'.

The MRI apparatus 300a or 300b may obtain final k-space data E1C+2E based on the first echo data E1 and the corrected second echo data E2C. The final k-space data E1C+2E may be k-space data reconstructed in the k-space. When the final k-space data E1C+2E is reconstructed, k-space data may be reconstructed based on data of the second echo data E2 other than the additional data 725 and the first echo data E1. The MRI apparatus 300a or 300b may use a GRAPPA method or the like to reconstruct the k-space data. Next, the MRI apparatus 300a or 300b may re-reconstruct the k-space data based on the second echo data E2 including the additional data 725 and the corrected first echo data E1C. In this case, a GRAPPA method or the like may be re-applied to the additional data 725, and the MRI apparatus 300a or 300b may obtain the final k-space data E1C+2E.

Figure 8A:
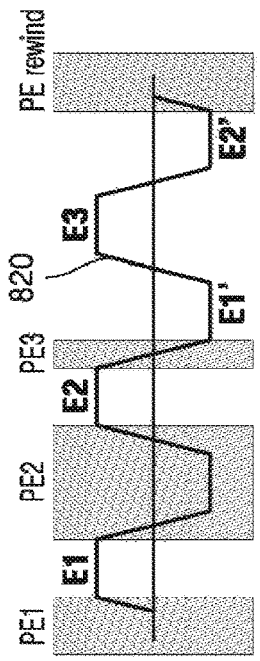
FIG. 8A is a pulse sequence diagram of a pulse sequence with an ETL of 3 applied by the MRI apparatus of FIG. 3A or 3B, according to an exemplary embodiment.
Figure 8A:
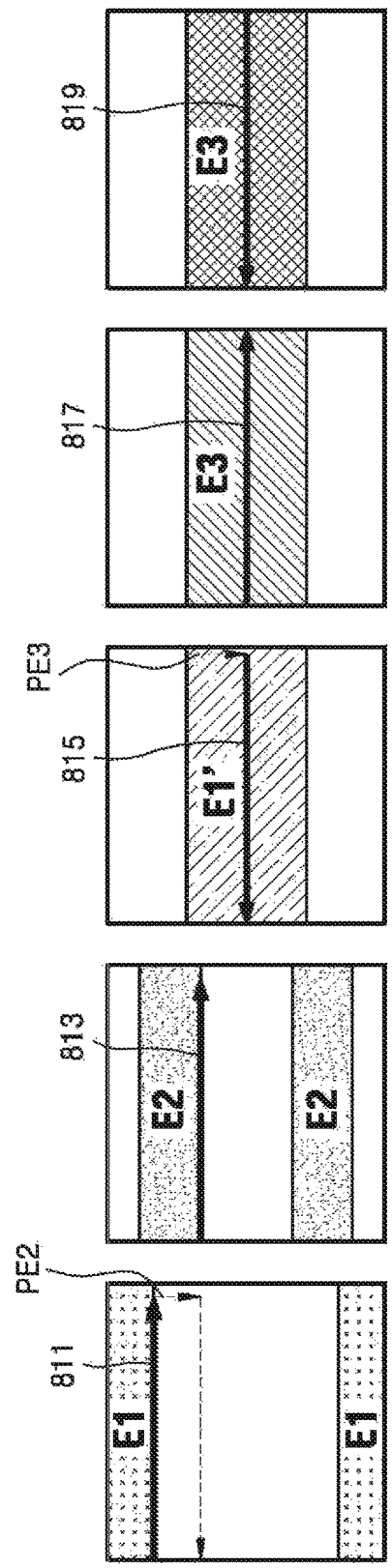

FIG. 8A is a pulse sequence diagram 810 of a pulse sequence with an ETL of 3 applied by the MRI apparatus 300a or 300b, according to an exemplary embodiment.

Referring to FIG. 8A, the MRI apparatus 300a or 300b may apply a gradient magnetic field 820 according to a multi-echo sequence shown in the pulse sequence diagram 810.

The pulse sequence diagram 810 shows the gradient magnetic fields PE1, PE2, and PE rewind of a phase encoding direction and the gradient magnetic field 820 of a readout direction applied by the MRI apparatus 300a or 300b according to an exemplary embodiment during one TR.

Referring to FIG. 8A, the MRI apparatus 300a or 300b may apply the gradient magnetic field 820 for generating a plurality of echoes in the readout direction of a k-space as shown in the pulse sequence diagram 810. The pulse sequence diagram 810 of FIG. 8A is different from the pulse sequence diagram 710 of FIG. 7A in that an echo corresponding to the fifth echo time TE3 may be additionally generated.

When the pulse sequence diagram 810 of FIG. 8A and the pulse sequence diagram 710 of FIG. 7A are compared with each other, the gradient magnetic field 820 of the readout direction has an ETL of 3, whereas the gradient magnetic field 720 of the readout direction in the pulse sequence diagram 710 has an ETL of 2 and there is a difference in the gradient magnetic field 820 of the readout direction and the gradient magnetic fields PE1, PE2, and PE rewind of the phase encoding direction, and thus the following will focus on the difference.

The MRI apparatus 300a or 300b may obtain the first echo data E1, the second echo data E2, and the fifth echo data E3 by using echoes generated at the first echo time TE1, the second echo time TE2, and the fifth echo time TE3 included in one TR. The MRI apparatus 300a or 300b reconstructs a final k-space by obtaining the first echo data E1, the second echo data E2, and the fifth echo data E3.

First, the MRI apparatus 300a or 300b may determine a position of the first echo data E1 on a ky-axis in the k-space by applying the gradient magnetic field PE1 of the phase encoding direction before obtaining the first echo data E1.

After the gradient magnetic field PE1 of the phase encoding direction is applied, the MRI apparatus 300a or 300b may fill one line of data among the first echo data E1 of the k-space in a positive direction 811 by using a readout gradient magnetic field corresponding to the first echo time TE1.

The MRI apparatus 300a or 300b may determine a position of the second echo data E2 on the ky-axis in the k-space by applying the gradient magnetic field PE2 of the phase encoding direction before obtaining the second echo data E2.

The MRI apparatus 300a or 300b may fill one line of data among the second echo data E2 of the k-space in a positive direction 813 by causing a sign of the readout gradient magnetic field corresponding to the echo time TE2 to be the same as that used to obtain the first echo data E1.

The MRI apparatus 300a or 300b may determine a position of the third echo data E1' on the ky-axis in the k-space by applying the gradient magnetic field PE3 of the phase encoding direction before obtaining the third echo data E1'.

The MRI apparatus 300a or 300b may fill one line of data among the third echo data E1' of the k-space in a negative direction 815 by using a readout gradient magnetic field corresponding to the third echo time TE1' by reversing a sign of the readout gradient magnetic field.

The MRI apparatus 300a or 300b may fill one line of data among the fifth echo data E3 of the k-space in a positive direction 817 by using a readout gradient magnetic field corresponding to the fifth echo time TE3 by re-reversing a sign of the readout gradient magnetic field.

Next, the MRI apparatus 300a or 300b may fill one line of data among the fourth echo data E2' of the k-space in a negative direction 819 by using a readout gradient magnetic field corresponding to the fourth echo time TE2' by re-reversing a sign of the readout gradient magnetic field.

When the MRI apparatus 300a or 300b applies the gradient magnetic field PE rewind of the phase encoding direction, data of the k-space of a next TR may be placed at a position whose ky-coordinate is 0.

Referring to FIG. 8A, the MRI apparatus 300a or 300b may obtain the first echo data E1 corresponding to the first echo time TE1, the second echo data E2 corresponding to the second echo time TE2, the third echo data E1' corresponding to the third echo time TE1', the fourth echo data E2' corresponding to the fourth echo time TE2', and the fifth echo data E3 corresponding to the fifth echo time TE3 by applying the gradient magnetic field 820 during several TRs.

The directions 811, 813, and 817, in which pieces of data are placed in the k-space when the MRI apparatus 300a or 300b obtains the first echo data E1, the second echo data E2, and the fifth echo data E3, are the same. That is, a readout gradient magnetic field applied at the first echo time TE1, a readout gradient magnetic field applied at the second echo time TE2, and a readout gradient magnetic field applied at the fifth echo time TE3 have the same sign.

The directions 815 and 819, in which pieces of data are placed in the k-space when the MRI apparatus 300a or 300b obtains the third echo data E1' and the fourth echo data E2', are the same. If the MRI apparatus 300a or 300b generates a B0 map by using the third echo data E1' and the fourth echo data E2', an error caused when directions of echo time shifts differ from each other may be minimized.

As shown in FIG. 8A, the fifth echo data E3 may include data of a central part of the k-space, and the first echo data E1 and the second echo data E2 may not include the data of the central part of the k-space.

Referring to FIG. 8A, when a T2 or T2*-weighted image is to be obtained, the MRI apparatus 300a or 300b may determine the fifth echo time TE3 as a reference echo time. In this case, the fifth echo data E3 that is reference echo data may include an overlapping part in the k-space with the second echo data E2. Also, the second echo data E2 may include an overlapping part in the k-space with the first echo data E1.

Figure 8B:
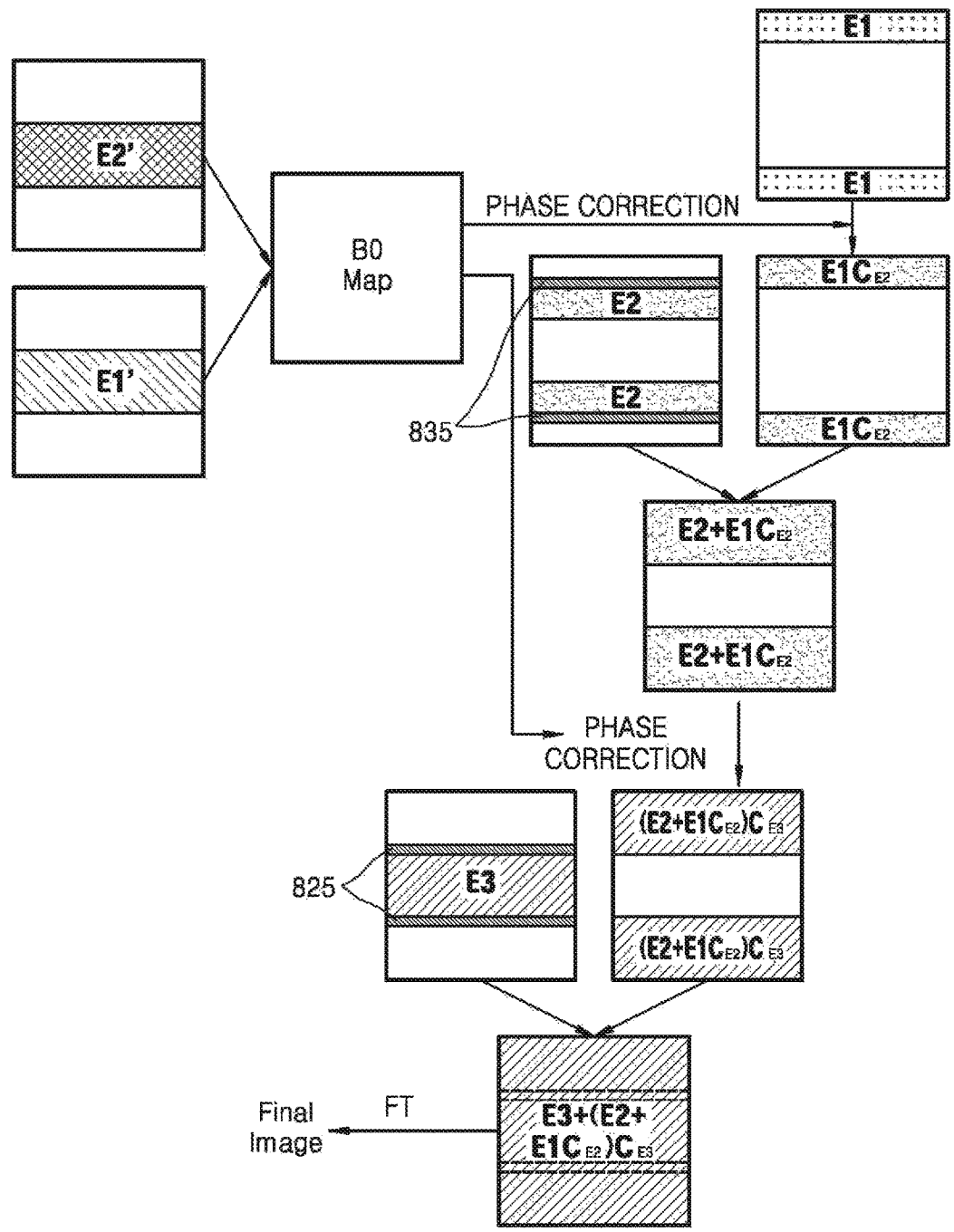
FIG. 8B is a diagram illustrating a process performed by the MRI apparatus of FIG. 3A or 3B to obtain an MR image, according to the pulse sequence diagram of FIG. 8A, according to an exemplary embodiment.

FIG. 8B is a diagram illustrating a process performed by the MRI apparatus 300a or 300b to obtain an MR image, according to the pulse sequence diagram 810 of FIG. 8A, according to an exemplary embodiment.

Referring to FIG. 8B, the MRI apparatus 300a or 300b performs a process of reconstructing a final image based on the first echo data E1 corresponding to the first echo time TE1, the second echo data E2 corresponding to the second echo time TE2, and the fifth echo data E3 corresponding to the fifth echo time TE3.

The MRI apparatus 300a or 300b according to an exemplary embodiment may obtain the first echo data E1 corresponding to the first echo time TE1, may obtain the second echo data E2 corresponding to the second echo time TE2 that is later than the first echo time TE1, and may obtain the fifth echo data E3 corresponding to the fifth echo time TE3 that is later than the second echo time TE2. Also, the MRI apparatus 300a or 300b may obtain the third echo data E1' corresponding to the third echo time TE1' and the fourth echo data E2' corresponding to the fourth echo time TE2' to perform phase correction.

Referring to FIG. 8B, reference echo data may be the fifth echo data E3 and a reference echo time may be the fifth echo time TE3. In this case, the fifth echo data E3 may further include additional data 825 about the overlapping part in the k-space with the second echo data E2. Also, the second echo data E2 may further include additional data 835 about the overlapping part in the k-space with the first echo data E1.

First, the MRI apparatus 300a or 300b according to an exemplary embodiment may perform phase correction on the first echo data E1. As described with reference to FIG. 6A, because the directions 815 and 819, in which pieces of data are placed in the k-space when the MRI apparatus 300a or 300b obtains the third echo data E1' and the fourth echo data E2', are the same, an error caused by an echo time shift may be minimized.

The MRI apparatus 300a or 300b may perform phase correction on the first echo data E1 and may obtain first echo data $E1C_{E2}$ whose phase is corrected based on the second echo time TE2. The phase correction may be performed by using a B0 map generated by using the third echo data E1' and the fourth echo data E2'.

The MRI apparatus 300a or 300b performs first phase correction on the first echo data E1 and then performs second phase correction on intermediate k-space data $E2+E1C_{E2}$ obtained based on the second echo data E2 and the corrected first echo data $E1C_{E2}$. The first phase correction may be performed based on a phase of the second echo data E2 and the second phase correction may be performed based on a phase of the fifth echo data E3.

The MRI apparatus 300a or 300b may obtain the intermediate k-space data $E2+E1C_{E2}$ based on the second echo data E2 and the corrected first echo data $E1C_{E2}$. If the second echo data E2 and the fifth echo data E3 are under-sampled k-space data, the intermediate k-space data $E2+E1C_{E2}$ may be data reconstructed by using a GRAPPA method or a SMASH method.

Also, when the intermediate k-space data $E2+E1C_{E2}$ is reconstructed, the MRI apparatus 300a or 300b may reconstruct k-space data based on data of the second echo data E2 other than the additional data 835 and the fifth echo data E3. The MRI apparatus 300a or 300b may use a GRAPPA method or the like to reconstruct k-space data. Next, the MRI apparatus may re-reconstruct the k-space data based on the second echo data E2 including the additional data 835 and the corrected first echo data $E1C_{E2}$. In this case, a GRAPPA method or the like may be re-applied to the additional data 835, and the MRI apparatus 300a or 300b may obtain the intermediate k-space data $E2+E1C_{E2}$.

Next, the MRI apparatus 300a or 300b may perform second phase correction on the intermediate k-space data $E2+E1C_{E2}$ obtained based on the second echo data E2 and the corrected first echo data $E1C_{E2}$.

The MRI apparatus 300a or 300b may perform phase correction on the intermediate k-space data $E2+E1C_{E2}$ and may obtain intermediate k-space data $(E2+E1C_{E2})C_{E3}$ whose phase is corrected based on the fifth echo time TE3. The phase correction may be performed by using a B0 map generated by using the third echo data E1' and the fourth echo data E2'.

The MRI apparatus 300a or 300b may obtain final k-space data $E3+(E2+E1C_{E2})C_{E3}$ based on the first echo data E1 and the corrected intermediate k-space data $(E2+E1C_{E2})C_{E3}$. The final k-space data $E3+(E2+E1C_{E2})C_{E3}$ may be k-space data reconstructed in the k-space.

A method performed by the MRI apparatus 300a or 300b to reconstruct the final k-space data $E3+(E2+E1C_{E2})C_{E3}$ by using the additional data 825 is similar to that described with reference to FIG. 7B, and thus an explanation thereof will not be given.

Figure 9A:
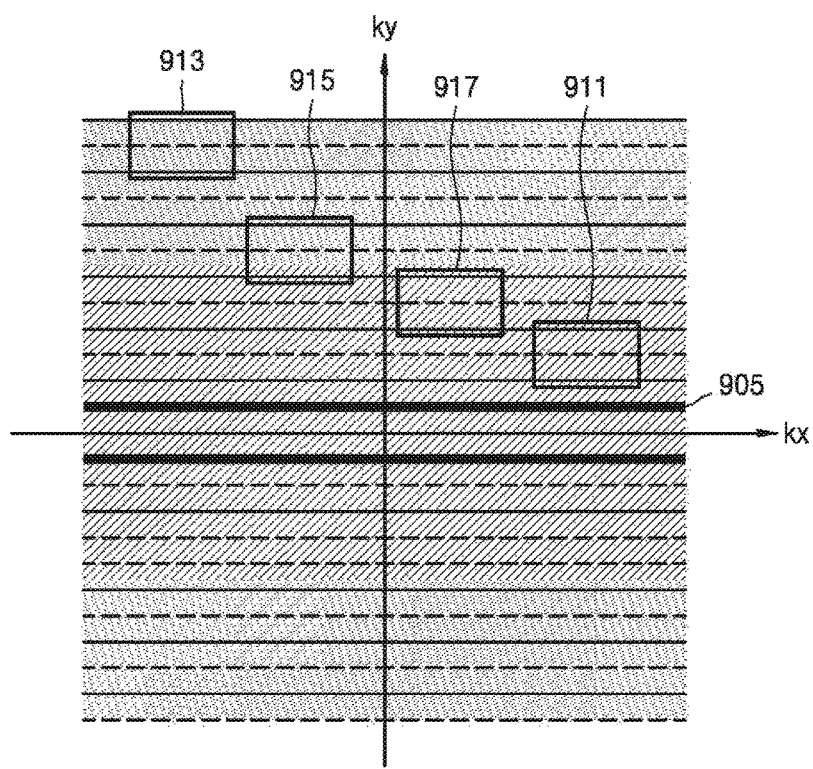
FIG. 9A is a diagram illustrating first echo data and second echo data obtained by the MRI apparatus of FIG. 3A or 3B.

FIG. 9A is a diagram illustrating the first echo data E1 and the second echo data E2 obtained by the MRI apparatus 300a or 300b.

In detail, FIG. 9A illustrates the first echo data E1 that is under-sampled and the second echo data E2 that is under-sampled in a k-space.

Referring to FIG. 9A, a data line that is actually obtained is marked by a solid line. Also, a data line to be constructed by using a GRAPPA method is marked by a dashed line. Also, an auto calibrating signal (ACS) may be obtained at a position whose ky-coordinate in the k-space is close to 0. For example, a line 905 marked by a thick solid line may be an ACS line.

Also, each of first through fourth kernels 911, 913, 915, and 917 of FIG. 9A may be a kernel having a size of 2*5. That is, the MRI apparatus 300a or 300b may use a GRAPPA method by using a correlation between 2*5 pieces of data included in the first through fourth kernels 911, 913, 915, and 917.

Referring to FIG. 9A, the first kernel 911 and the fourth kernel 917 may include only the first echo data E1. Also, the second kernel 913 may include only the second echo data E2. The third kernel 915 may include both the first echo data E1 and the second echo data E2.

The accuracy of reconstructed data when the MRI apparatus 300a or 300b uses a GRAPPA method based on the third kernel 915 including pieces of data obtained by using different echoes, that is, the first echo data E1 and the second echo data E2, may be lower than that when the MRI apparatus 300a or 300b uses a GRAPPA method based on the first kernel 911, the second kernel 913, and the fourth kernel 917 including pieces of echo data obtained by using the same echo.

A case where additional data about an overlapping part between the first echo data E1 and the second echo data E2 is used to improve the accuracy of reconstructed data based on the third kernel 915 will now be explained with reference to FIG. 9B.

FIG. 9B is a diagram illustrating a process of reconstructing k-space data by applying a GRAPPA method to the first echo data E1 and the second echo data E2 obtained by the MRI apparatus 300a or 300b, according to an exemplary embodiment.

In FIG. 9B, a diagram 910 shows the first echo data E1 that is under-sampled and the second echo data E2 that is under-sampled. The diagram 910 of FIG. 9B illustrates a part of the first echo data E1 that is under-sampled other than additional data about an overlapping part in a k-space with the second echo data E2. Also, a diagram 920 of FIG. 9B illustrates pieces of additional data 922 and 924 of the first echo data E1 that is under-sampled.

First, as shown in a diagram 930 of FIG. 9B, the MRI apparatus 300a or 300b may obtain reconstructed k-space data based on the first echo data E1 that is under-sampled and the second echo data E2 that is under-sampled. For example, the MRI apparatus 300a or 300b may obtain the reconstructed k-space data by applying a GRAPPA method to the first echo data E1 that is under-sampled and the second echo data E2 that is under-sampled.

Next, as shown in a diagram 940 of FIG. 9B, the MRI apparatus 300a or 300b may perform phase correction on the second echo data E2 of the diagram 930 and may obtain the corrected second echo data E2C.

Next, as shown in a diagram 950 of FIG. 9B, the MRI apparatus 300a or 300b may apply a GRAPPA method to pieces of additional data 952 and 954.

The pieces of additional data 952 and 954 shown in the diagram 950 of FIG. 9B may correspond to the pieces of additional data 922 and 924 of the diagram 920. Also, the pieces of additional data 952 and 954 of the diagram 950 of FIG. 9B may correspond to data having a low accuracy among the reconstructed k-space data of the diagram 930. As shown in the diagram 950 of FIG. 9B, when a GRAPPA method is re-used based on the pieces of additional data 952 and 954, the accuracy of the reconstructed k-space data may be improved.

The additional data 952 of the diagram 950 of FIG. 9B may be the first echo data E1 that is under-sampled. That is, the additional data 952 may include a data line 955 that is actually obtained and a data line 953 to which a GRAPPA method is applied. Although the pieces of additional data 952 and 954 are shown as two lines in FIG. 9B, the pieces of additional data 952 and 954 may account for about 10% of an entire k-space data line. The additional data 954 of the diagram 950 of FIG. 9B may also be the first echo data E1 that is under-sampled, like the additional data 952.

As shown in the diagram 950, when GRAPPA is applied to the pieces of additional data 952 and 954, data lines located over and under the pieces of additional data 952 and 954 may be further used in consideration of a size of a kernel. For example, data lines of the diagram 940 of FIG. 9B may be located over and under the pieces of additional data 952 and 954.

For example, a data line 951 located under the additional data 952 may correspond to a data line 941 of the diagram 940 of FIG. 9B, and a data line 957 located over the additional data 952 may correspond to a data line 947 of the diagram 940 of FIG. 9B. Likewise, data lines of the diagram 940 of FIG. 9B may also be located over and under the additional data 954.

Referring to a diagram 960 of FIG. 9B, the MRI apparatus 300a or 300b may obtain pieces of reconstructed additional data 962 and 964 by applying a GRAPPA method to the pieces of additional data 952 and 954 of the diagram 950. Data lines 963 and 969 obtained after applying a GRAPPA method to the pieces of reconstructed additional data 962 and 964 of the diagram 960 of FIG. 9B may correspond to data lines 953 and 959 of the pieces of additional data 952 and 954 of the diagram 950.

Referring to a diagram 970 of FIG. 9B, the MRI apparatus 300a or 300b may obtain final k-space data by replacing first echo data 942 and 944 corresponding to additional data among data lines of the diagram 940 of FIG. 9B with the pieces of reconstructed additional data 962 and 964.

Figure 10A:
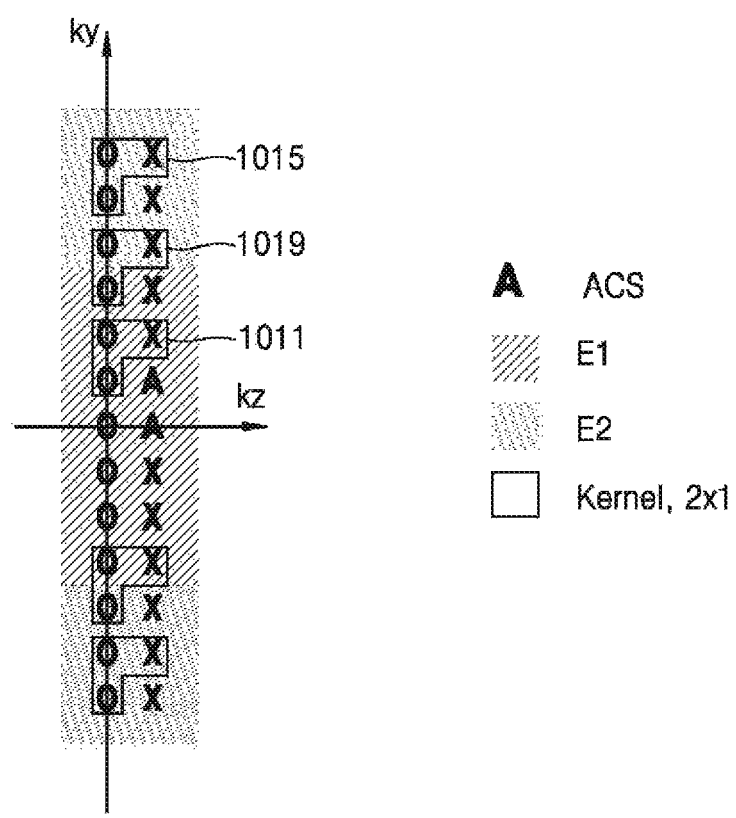
FIG. 10A is a diagram illustrating the first echo data and the second echo data obtained by the MRI apparatus of FIG. 3A or 3B, using a multi-band method.

FIG. 10A is a diagram illustrating the first echo data E1 and the second echo data E2 obtained by the MRI apparatus 300a or 300b, using a multi-band method.

In detail, FIG. 10A illustrates the first echo data E1 and the second echo data E2, which are obtained by using a multi-band method, on a ky-axis and a kz-axis. Data of a kx-axis is not shown. Echo data obtained by using a multi-band method refers to k-space data about two slices having different z-coordinates. For example, echo data obtained by using a multi-band method may be a sum of pieces of k-space data about two slices, or a difference between pieces of k-space data about two slices. When echo data obtained by using a multi-band method is reconstructed by using a GRAPPA method, a final image of two slices may be reconstructed by reconstructing two lines of data in the kz-axis.

Referring to FIG. 10A, a part O is a part that obtains data and a part X is a part that does not obtain data. Also, a part A is an ACS.

In detail, the part O of FIG. 10A is a part including both pieces of data about two slices obtained by using a multi-band method.

Also, the part X of FIG. 10A may be a part that has to obtain data by using a GRAPPA method. The part X of FIG. 10A may be obtained by using a correlation between pieces of data included in, for example, a kernel of 2*1.

Referring to FIG. 10A, a first kernel 1011 may include only the first echo data E1. Also, a second kernel 1015 may include only the second echo data E2. A third kernel 1019 may include both the first echo data E1 and the second echo data E2.

The accuracy of reconstructed data when the MRI apparatus 300a or 300b uses a GRAPPA method based on the third kernel 1019 including echo data obtained by using different echoes, that is, both the first echo data E1 and the second echo data E2, may be lower than that when the MRI apparatus 300a or 300b uses a GRAPPA method based on the first kernel 1011 and the second kernel 1015 including echo data obtained by using the same echo.

A case where additional data about an overlapping part between the first echo data E1 and the second echo data E2 is used to improve the accuracy of data reconstructed based on the third kernel 1019 will now be explained with reference to FIG. 10B.

FIG. 10B is a diagram illustrating a process of reconstructing k-space data by applying a GRAPPA method to the first echo data E1 and the second echo data E2 obtained by the MRI apparatus 300a or 300b, using a multi-band method, according to an exemplary embodiment.

A diagram 1010 of FIG. 10B shows the first echo data E1 and the second echo data E2 obtained by using a multi-band method. The diagram 1010 of FIG. 10B illustrates data of the first echo data E1, which is obtained by using a multi-band method, other than additional data about an overlapping part in a k-space with the second echo data E2. Also, a diagram 1020 of FIG. 10B illustrates pieces of additional data 1022 and 1024 of the first echo data E1 obtained by using a multi-band method.

First, as shown in a diagram 1030 of FIG. 10B, the MRI apparatus 300a or 300b may obtain reconstructed k-space data based on the first echo data E1 and the second echo data E2 obtained by using a multi-band method. A part O of FIG.

10B is a part including both pieces of data about two slices obtained by using a multi-band method.

For example, the MRI apparatus 300a or 300b may obtain reconstructed k-space data by applying a GRAPPA method to the first echo data E1 and the second echo data E2 obtained by using a multi-band method. In this case, the MRI apparatus 300a or 300b may reconstruct k-space data about a part X of the diagram 1010 by using a kernel 1031 having a size of 2*1. Referring to the diagram 1030 of FIG. 10B, a part o is a part indicating k-space data reconstructed by using echo data obtained by using the same echo. Also, a part c is a part indicating k-space data reconstructed by using echo data obtained by using different echoes.

Next, as shown in a diagram 1040 of FIG. 10B, the MRI apparatus 300a or 300b may perform phase correction on the second echo data E2 of the diagram 1030 and may obtain the corrected second echo data E2C.

Next, as shown in a diagram 1050 of FIG. 10B, the MRI apparatus 300a or 300b may apply a GRAPPA method to pieces of additional data 1052 and 1054.

The pieces of additional data 1052 and 1054 shown in the diagram 1050 of FIG. 10B may correspond to the pieces of additional data 1022 and 1024 of the diagram 1020. Also, the pieces of additional data 1052 and 1054 of FIG. 10B may correspond to data having a low accuracy among the reconstructed k-space data of the diagram 1030. As shown in the diagram 1050 of FIG. 10B, when a GRAPPA method is re-applied to the pieces of additional data 1052 and 1054, the accuracy of the reconstructed k-space data may be improved.

The pieces of additional data 1052 and 1054 of the diagram 1050 of FIG. 10B may be the first echo data E1 obtained by using a multi-band method. Also, the pieces of additional data 1052 and 1054 may include a part X to which a GRAPPA method is to be applied and a part O that is actually obtained. Although the pieces of additional data 1052 and 1054 are shown as one line in FIG. 10B, the pieces of additional data 1052 and 1054 may correspond to a data line that actually accounts for about 10% of the entire k-space.

As shown in the diagram 1050, when a GRAPPA method is applied to the pieces of additional data 1052 and 1054, pieces of data located over and under the pieces of additional data 1052 and 1054 may be further used in consideration of a size of a kernel. For example, pieces of data of the diagram 1040 of FIG. 10B may be located over and under the pieces of additional data 1052 and 1054.

For example, pieces of data 1051 and 1053 located under the additional data 1052 may correspond to pieces of data 1041 and 1043 of the diagram 1040 of FIG. 10B, and data 1055 located over the additional data 1052 may correspond to data 1045 of the diagram 1040 of FIG. 10B. Likewise, pieces of data of the diagram 1040 of FIG. 10B may also be located over and under the additional data 1054.

Referring to a diagram 1060 of FIG. 10B, the MRI apparatus 300a or 300b may obtain pieces of additional data 1062 and 1064 reconstructed by applying a GRAPPA method to the pieces of additional data 1052 and 1054 of the diagram 1050. The pieces of reconstructed additional data 1062 and 1064 of the diagram 1060 of FIG. 10B may be obtained by using a correlation between pieces of data included in a kernel 1061 shown in the diagram 1060 of FIG. 10B. The reconstructed additional data 1062 may include k-space data reconstructed by using echo data obtained by using the same echo and the reconstructed additional data 1064 may include k-space data reconstructed by using echo data obtained by using different echoes.

Referring to a diagram 1070 of FIG. 10B, the MRI apparatus 300a or 300b may obtain final k-space data by replacing at least parts of pieces of data 1042 and 1044 including additional data among pieces of data of the diagram 1040 of FIG. 10B with the pieces of reconstructed additional data 1062 and 1064. That is, parts of data 1072 and 1074 of the final k-space data may correspond to the pieces of additional data 1062 and 1064.

Figure 11:
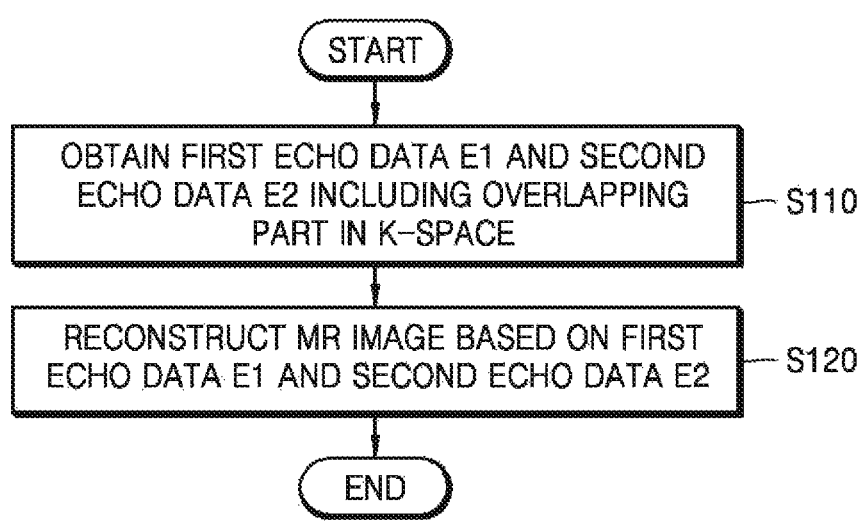
FIG. 11 is a flowchart illustrating a method of an MRI apparatus, according to an exemplary embodiment.

FIG. 11 is a flowchart illustrating a method of an MRI apparatus, according to an exemplary embodiment.

The method according to an exemplary embodiment may be performed by the MRI apparatus 300a or 300b. Also, the method according to an exemplary embodiment may be a method of obtaining an MR image by using a multi-echo sequence.

In operation S110, the MRI apparatus 300a or 300b may obtain the first echo data E1 and the second echo data E2 including an overlapping part in a k-space.

In detail, the MRI apparatus 300a or 300b may obtain the first echo data E1 by using an echo generated at the first echo time TE1 and may obtain the second echo data E2 by using an echo generated at the second echo time TE2 that is later than the first echo time TE1.

In operation S120, the MRI apparatus 300a or 300b may reconstruct an MR image based on the first echo data E1 and the second echo data E2.

Figure 12:
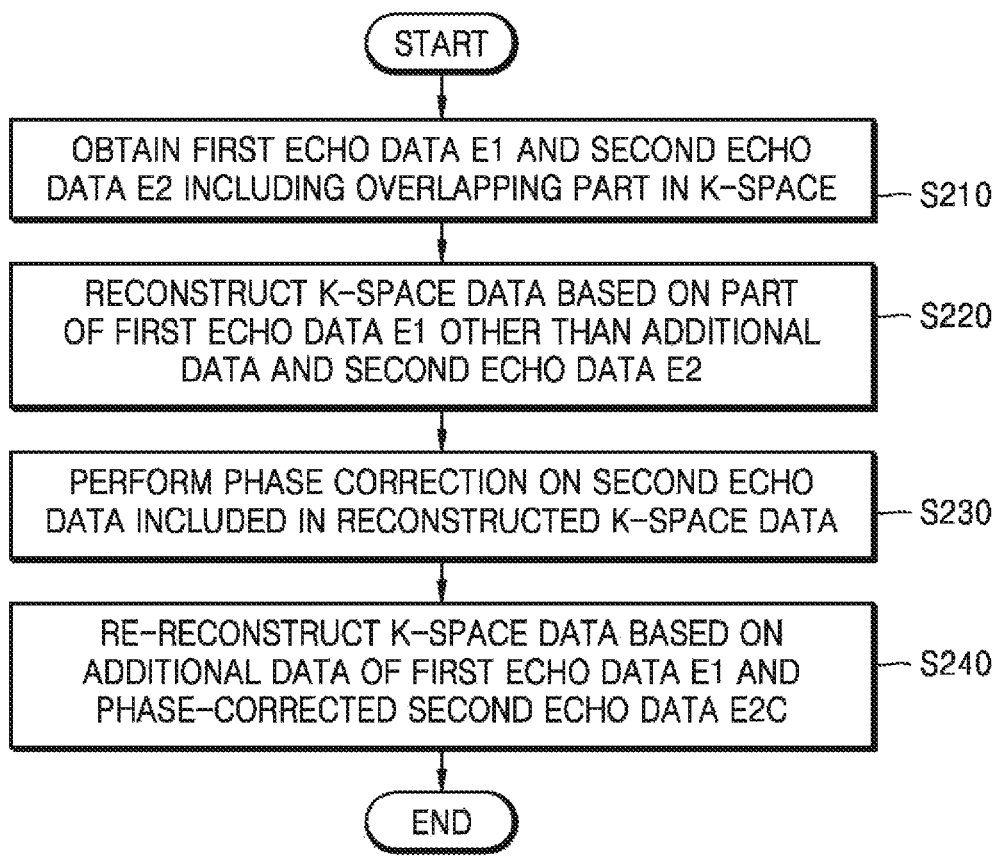
FIG. 12 is a flowchart illustrating another method of an MRI apparatus, according to an exemplary embodiment.

FIG. 12 is a flowchart illustrating another method of an MRI apparatus, according to an exemplary embodiment.

The method according to an exemplary embodiment may be performed by the MRI apparatus 300a or 300b. The MRI apparatus 300a or 300b performs phase correction on echo data obtained by using different echoes.

In operation S210, the MRI apparatus 300a or 300b may obtain the first echo data E1 and the second echo data E2 including an overlapping part in a k-space.

In operation S220, the MRI apparatus 300a or 300b may reconstruct k-space data based on a part of the first echo data E1 other than additional data and the second echo data E2.

In operation S230, the MRI apparatus 300a or 300b may perform phase correction on the second echo data E2 included in the reconstructed k-space data.

In operation S240, the MRI apparatus 300a or 300b may re-reconstruct the k-space data based on the additional data of the first echo data E1 and the second echo data E2C whose phase is corrected.

Figure 13:
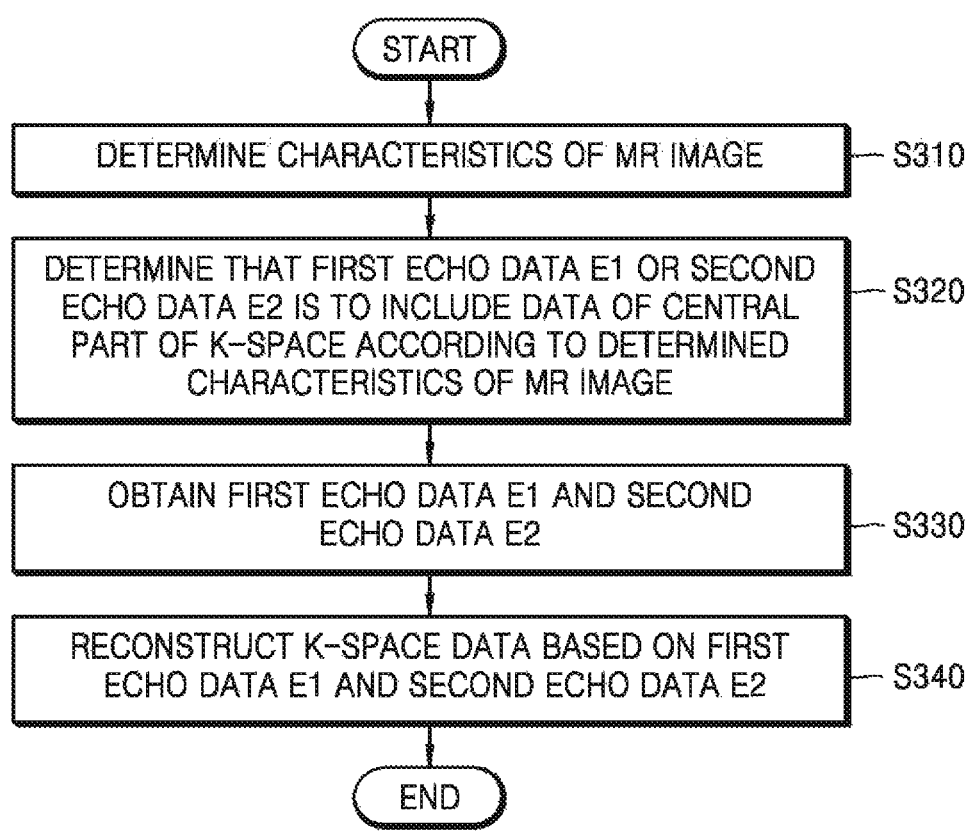
FIG. 13 is a flowchart illustrating another method of an MRI apparatus, according to an exemplary embodiment.

FIG. 13 is a flowchart illustrating another method of an MRI apparatus, according to an exemplary embodiment.

The method according to an exemplary embodiment may be performed by the MRI apparatus 300a or 300b.

In operation S310, the MRI apparatus 300a or 300b may determine characteristics of an MR image.

In operation S320, the MRI apparatus 300a or 300b may determine that the first echo data E1 or the second echo data E2 is to include data of a central part of a k-space according to the determined characteristics of the MR image.

In operation S330, the MRI apparatus 300a or 300b may obtain the first echo data E1 and the second echo data E2 including an overlapping part in the k-space.

In detail, the MRI apparatus 300a or 300b may obtain the first echo data E1 by using an echo generated at the first echo time TE1 and may obtain the second echo data E2 by using an echo generated at the second echo time TE2 that is later than the first echo time TE1.

In operation S340, the MRI apparatus 300a or 300b may reconstruct k-space data based on the first echo data E1 and the second echo data E2.

Figure 14:
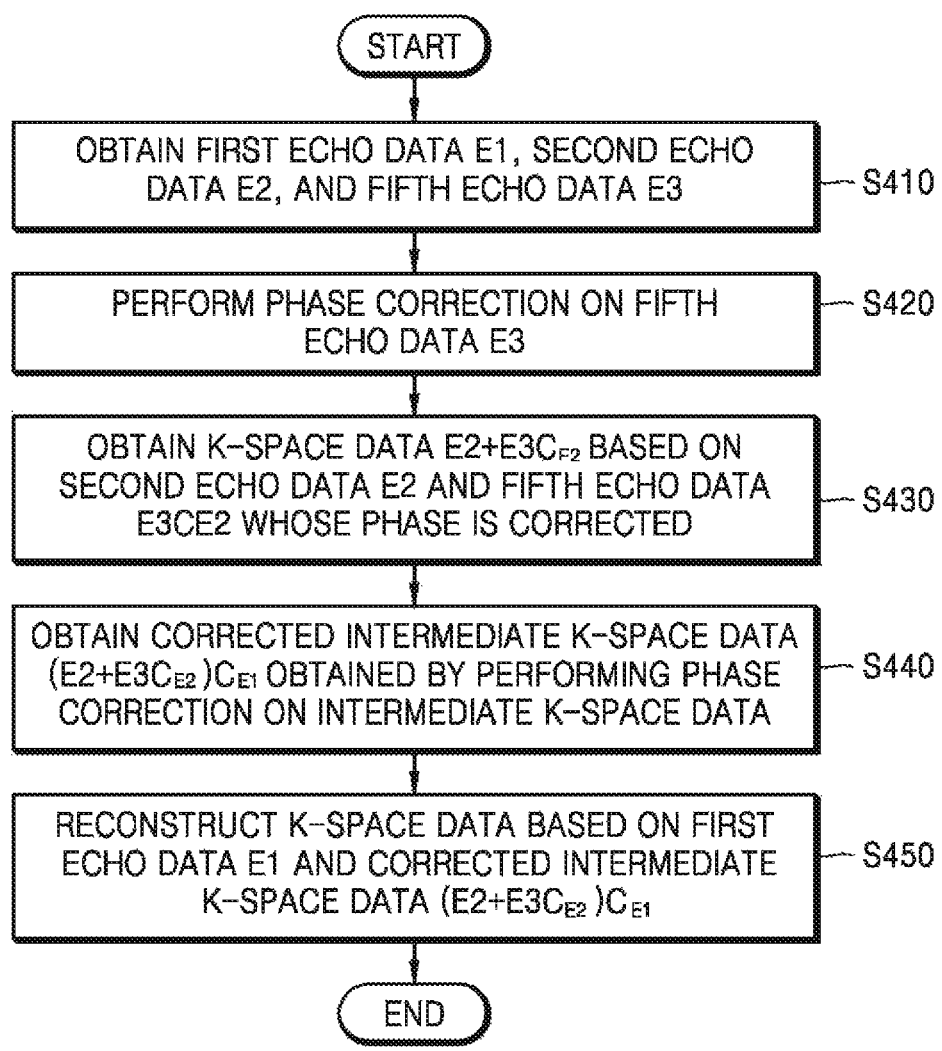
FIG. 14 is a flowchart illustrating another method of an MRI apparatus, according to an exemplary embodiment.

FIG. 14 is a flowchart illustrating another method of an MRI apparatus, according to an exemplary embodiment.

The method according to an exemplary embodiment may be performed by the MRI apparatus 300a or 300b.

In operation S410, the MRI apparatus 300a or 300b may obtain the first echo data E1, the second echo data E2, and the fifth echo data E3.

In operation S420, the MRI apparatus 300a or 300b may perform phase correction on the fifth echo data E3.

In operation S430, the MRI apparatus 300a or 300b may obtain the intermediate k-space data E2+E3$C_{E2}$ based on the second echo data E2 and the fifth echo data E3$C_{E2}$ whose phase is corrected.

In operation S440, the MRI apparatus 300a or 300b may perform phase correction on the intermediate k-space data E2+E3$C_{E2}$ to obtain the corrected intermediate k-space data (E2+E3$C_{E2}$)$C_{E1}$.

In operation S450, the MRI apparatus 300a or 300b may reconstruct k-space data based on the first echo data E1 and the corrected intermediate k-space data (E2+E3$C_{E2}$)$C_{E1}$.

Figure 15:
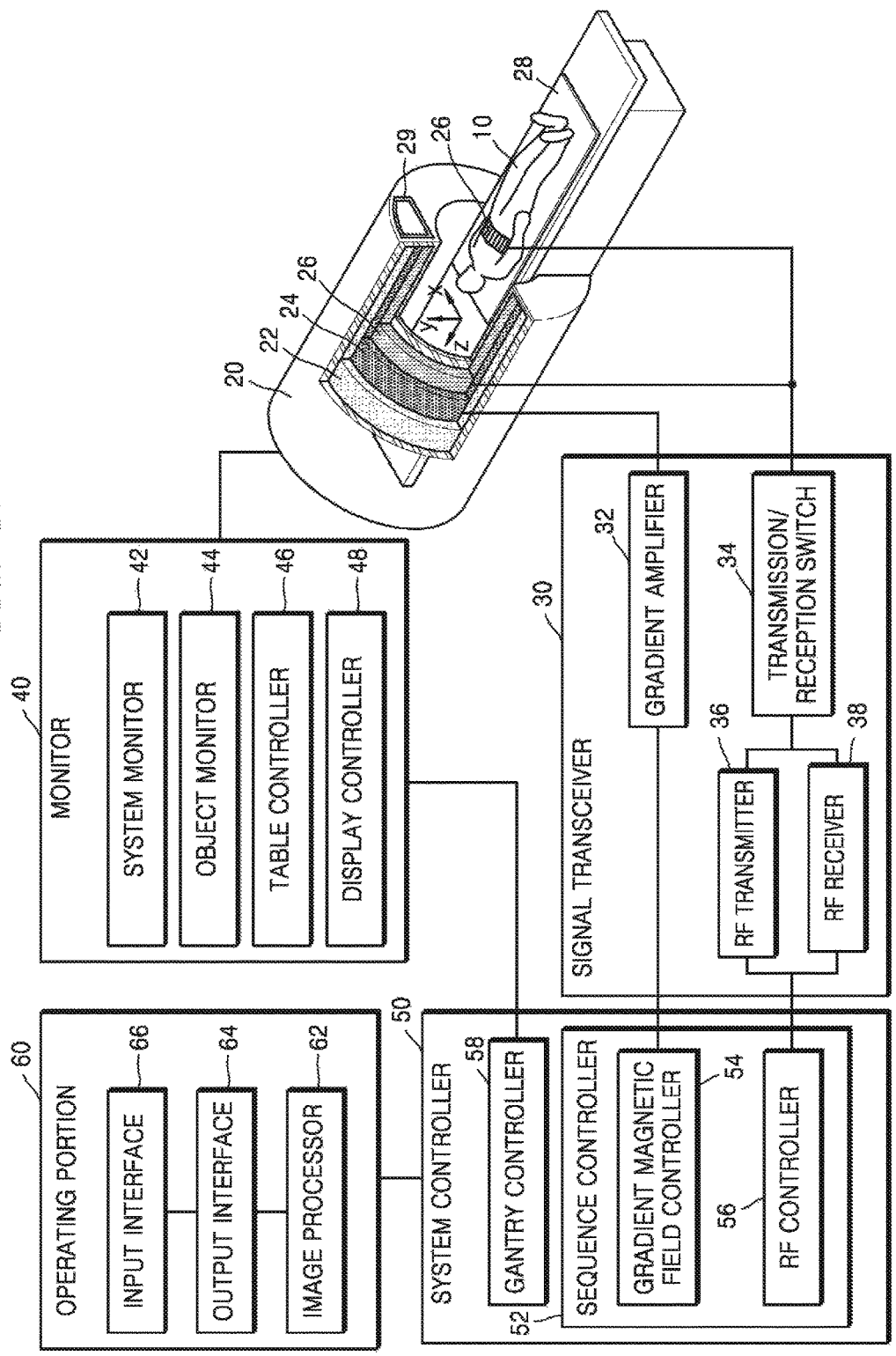
FIG. 15 is a block diagram of a general MRI system.

FIG. 15 is a block diagram of a general MRI system. Referring to FIG. 15, the general MRI system may include a gantry 20, a signal transceiver 30, a monitor 40, a system controller 50, and an operating portion 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal having the same frequency as that of the precessional motion, stop transmitting the RF signal, and then receive an MR signal emitted from the atomic nuclei included in the patient.

For example, to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Lamor frequency.

In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the object 10.

The RF coil 26 may be realized as one RF transmitting and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object 10, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil according to structures.

The RF coil 26 may be a transmission exclusive coil, a reception exclusive coil, or a transmission and reception coil according to methods of transmitting and receiving an RF signal.

The RF coil 26 may be an RF coil having various numbers of channels, such as 16 channels, 32 channels, 72 channels, and 144 channels.

The gantry 20 may further include a display 29 disposed outside the gantry 20 and a display disposed inside the gantry 20. The gantry 20 may provide predetermined information to the user or the object 10 through the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 may be controlled by a control signal output by an RF controller 56.

The signal transceiver 30 of FIG. 15 may include the data obtainer 310 of FIG. 3A or the data obtainer 315 of FIG. 3B. For example, the data obtainer 310 of FIG. 3A or the data obtainer 315 of FIG. 3B may be connected to the RF receiver 38 included in the signal transceiver 30, and may receive an MR signal from the RF receiver 38.

According to an exemplary embodiment, the signal transceiver 30 may obtain the first echo data E1 and the second echo data E2 by using the MR signal received through the RF receiver 38.

The monitor 40 may monitor or control the gantry 20 or devices mounted on the gantry 20. The monitor 40 may include a system monitor 42, an object monitor 44, a table controller 46, and a display controller 48.

The system monitor 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitor 44 monitors a state of the object 10. In detail, the object monitor 44 may include a camera for observing a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of the system controller 50. For example, during moving imaging of the object 10, the table controller 46 may continuously or discontinuously move the table 28 according to the sequence control of the system controller 50, and thus the object 10 may be imaged in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Also, when a speaker is located inside or outside the gantry 20, the display controller 48 may control the speaker to be on or off, or may control sound to be output via the speaker.

The system controller 50 may include a sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating portion 60. Here, the pulse sequence includes all information used to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating portion 60 may request the system controller 50 to transmit pulse sequence information while controlling an overall operation of the MRI system.

The operating portion 60 may include an image processor 62 for receiving and processing the MR signal received by the RF receiver 38, an output interface 64, and an input interface 66.

The image processor 62 may process the MR signal received from the RF receiver 38 to generate MR image data of the object 10.

The image processor 62 receives the MR signal received by the RF receiver 38 and performs any one or any combination of various signal processes, such as amplification, frequency transformation, phase detection, low frequency amplification, and filtering, on the received MR signal.

The image processor 62 may arrange digital data in a k-space (for example, also referred to as a Fourier space or a frequency space) of a memory, and rearrange the digital data into image data via 2D or 3D Fourier transformation.

The image processor 62 may perform a composition process or a difference calculation process on the image data. The composition process may include an addition process on a pixel or a maximum intensity projection (MIP) process. The image processor 62 may store not only the rearranged image data but also image data on which a composition process or a difference calculation process is performed, in a memory or an external server.

The image processor 62 may perform any of the signal processes on the MR signal in parallel. For example, the image processor 62 may perform a signal process on a plurality of MR signals received by a multi-channel RF coil in parallel to rearrange the plurality of MR signals into image data.

The image processor 62 of FIG. 15 may include the image processor 320 of FIG. 3A or the image processor 325 of FIG. 3B. For example, the image processor 62 may reconstruct an MR image by using the first echo data E1 and the second echo data E2 obtained by the signal transceiver 30.

The output interface 64 may output image data generated or rearranged by the image processor 62 to the user. The output interface 64 may also output information used for the user to manipulate the MRI system, such as a UI, user information, or object information. The output interface 64 may be a speaker, a printer, a CRT display, an LCD, a PDP display, an OLED display, an FED, an LED display, a VFD, a DLP display, an FPD, a 3D display, a transparent display, or any one or any combination of other various output devices that are well known to one of ordinary skill in the art.

The output interface 64 of FIG. 15 may include the output interface 340 of FIG. 15.

The user may input object information, parameter information, a scan condition, a pulse sequence, or information about image composition or difference calculation by using the input interface 66. The input interface 66 may be a keyboard, a mouse, a track ball, a voice recognizer, a gesture recognizer, a touch screen, or any one or any combination of other various input devices that are well known to one of ordinary skill in the art.

The signal transceiver 30, the monitor 40, the system controller 50, and the operating portion 60 are separate components in FIG. 15, but respective functions of the signal transceiver 30, the monitor 40, the system controller 50, and the operating portion 60 may be performed by another component. For example, the image processor 62 converts the MR signal received from the RF receiver 38 into a digital signal, but alternatively, the conversion of the MR signal into the digital signal may be performed by the RF receiver 38 or the RF coil 26.

The gantry 20, the RF coil 26, the signal transceiver 30, the monitor 40, the system controller 50, and the operating portion 60 may be connected to each other by wire or wirelessly, and when they are connected wirelessly, the MRI system may further include an apparatus for synchronizing clock signals therebetween. Communication between the gantry 20, the RF coil 26, the signal transceiver 30, the monitor 40, the system controller 50, and the operating portion 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), or optical communication.

Figure 16:
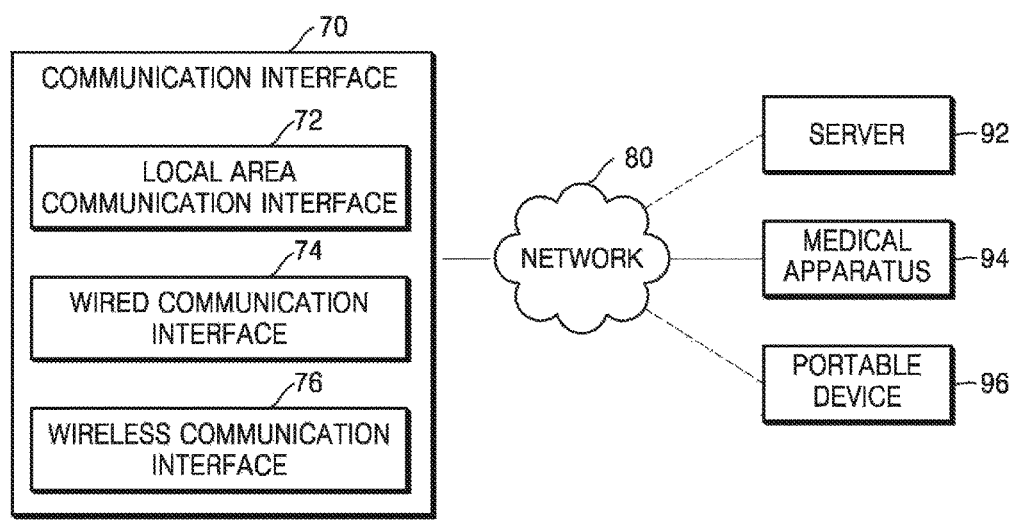
FIG. 16 is a block diagram of a communication interface according to an exemplary embodiment.

FIG. 16 is a block diagram of a communication interface 70 according to an exemplary embodiment. Referring to FIG. 16, the communication interface 70 may be connected to at least one selected from the gantry 20, the signal transceiver 30, the monitor 40, the system controller 50, and the operating portion 60 of FIG. 15.

The communication interface 70 may transmit and receive data to and from a hospital server or another medical apparatus in a hospital, which is connected through a picture archiving and communication system (PACS), and perform data communication according to the digital imaging and communications in medicine (DICOM) standard.

As shown in FIG. 16, the communication interface 70 may be connected to a network 80 by wire or wirelessly to communicate with a server 92, a medical apparatus 94, or a portable device 96.

In detail, the communication interface 70 may transmit and receive data related to the diagnosis of an object through the network 80, and may also transmit and receive a medical image captured by the medical apparatus 94, such as a CT apparatus, an MRI apparatus, or an X-ray apparatus. In addition, the communication interface 70 may receive a diagnosis history or a treatment schedule of the object from the server 92 and use the same to diagnose the object. The communication interface 70 may perform data communication not only with the server 92 or the medical apparatus 94 in a hospital, but also with the portable device 96, such as a mobile phone, a personal digital assistant (PDA), or a laptop of a doctor or patient.

Also, the communication interface 70 may transmit information about a malfunction of the MRI system or about medical image quality to a user through the network 80, and receive a feedback regarding the information from the user.

The communication interface 70 may include at least one component enabling communication with an external apparatus.

For example, the communication interface 70 may include a local area communication interface 72, a wired communication interface 74, and a wireless communication interface 76. The local area communication interface 72 refers to an interface for performing local area communication with an apparatus within a predetermined distance. Examples of local area communication technology according to an exemplary embodiment include, but are not limited to, a wireless local area network (LAN), Wi-Fi, Bluetooth, ZigBee, Wi-Fi direct (WFD), ultra wideband (UWB), infrared data association (IrDA), Bluetooth low energy (BLE), and near field communication (NFC).

The wired communication interface 74 refers to an interface for performing communication by using an electric signal or an optical signal. Examples of wired communication technology according to an exemplary embodiment include wired communication techniques using a pair cable, a coaxial cable, and an optical fiber cable, and other well known wired communication techniques.

The wireless communication interface 76 transmits and receives a wireless signal to and from at least one selected from a base station, an external apparatus, and a server in a mobile communication network. Here, the wireless signal may be a voice call signal, a video call signal, or data in any one or any combination of various formats according to transmission and reception of a text/multimedia message.

The server 92, the medical apparatus 94, or the portable device 96 connected to the MRI system may be, for example, the MRI apparatus 300a or 300b of FIG. 3A or 3B. That is, the communication interface 70 of FIG. 16 may be connected to the MRI apparatus 300a or 300b.

The MRI apparatus according to the one or more embodiments may improve the quality of a reconstructed final image by obtaining additional data about an overlapping part between first echo data and second echo data obtained at different echo times in a k-space.

Also, the MRI apparatus according to the one or more embodiments may reduce the effects of blur or aliasing that may occur in a final image as pieces of data obtained at different echo times are used by performing phase correction on first echo data and second echo data obtained at different echo times.

The above-described embodiments of the present disclosure may be written as computer programs and may be implemented in general-use digital computers that execute the programs using a computer-readable recording medium. Examples of the computer-readable recording medium include magnetic storage media (e.g., read-only memories (ROMs), floppy disks, hard disks, etc.), optical recording media (e.g., compact disk (CD)-ROMs, or digital versatile disks (DVDs), etc.), and transmission media such as Internet transmission media.

While the present disclosure has been shown and described with reference to embodiments thereof, it will be understood by one of ordinary skill in the art that various changes in form and details may be made therein without departing from the spirit and accordingly, the above embodiments and all aspects thereof are examples only and are not limiting.

What is claimed is:

1. A magnetic resonance imaging (MRI) apparatus for obtaining a magnetic resonance (MR) image, based on a multi-echo sequence, the MRI apparatus comprising:
   a data obtainer configured to obtain first echo data, based on an echo that is generated at a first echo time, and obtain second echo data, based on an echo that is generated at a second echo time later than the first echo time, the first echo data comprising a part overlapping a part included in the second echo data in a k-space; and
   an image processor configured to:
   generate a B0 map, based on third echo data and fourth echo data that are obtained based on an echo that is generated at a third echo time and an echo that is generated at a fourth echo time, respectively;
   perform phase correction on either one or both of the first echo data and the second echo data, based on the generated B0 map; and
   reconstruct the MR image, based on the first echo data and the second echo data.

2. The MRI apparatus of claim 1, wherein the image processor is further configured to:

perform phase correction on either one or both of the first echo data and the second echo data; and reconstruct the MR image, based on either one or both of the first echo data and the second echo data on which the phase correction is performed.

3. The MRI apparatus of claim 2, wherein either one or each of the first echo data and the second echo data comprises data of a central part of the k-space.

4. The MRI apparatus of claim 3, wherein the image processor is further configured to perform phase correction, based on a phase of the data of the central part of the k-space among the first echo data and the second echo data.

5. The MRI apparatus of claim 1, further comprising a gradient magnetic field controller configured to control a gradient magnetic field that is applied, based on the multi-echo sequence, wherein a sign of a readout gradient magnetic field that is applied at the first echo time is the same as a sign of a readout gradient magnetic field that is applied at the second echo time.

6. The MRI apparatus of claim 1, wherein the data obtainer is further configured to, in response to the first echo data comprising data of a central part of the k-space and the second echo data not comprising the data of the central part of the k-space, obtain additional data of the overlapping part included in the first echo data, based on the echo generated at the first echo time.

7. The MRI apparatus of claim 1, wherein the data obtainer is further configured to, in response to the second echo data comprising data of a central part of the k-space and the first echo data not comprising the data of the central part of the k-space, obtain additional data of the overlapping part included in the second echo data, based on the echo generated at the second echo time.

8. The MRI apparatus of claim 1, wherein the data obtainer is further configured to:

determine characteristics of the MR image to be obtained; and determine that the first echo data or the second echo data is to comprise data of a central part of the k-space, based on the determined characteristics of the MR image.

9. The MRI apparatus of claim 1, further comprising a gradient magnetic field controller configured to control a gradient magnetic field that is applied, based on the multi-echo sequence, wherein a sign of a readout gradient magnetic field that is applied at the third echo time is the same as a sign of a readout gradient magnetic field that is applied at the fourth echo time.

10. The MRI apparatus of claim 1, wherein the first echo time, the second echo time, the third echo time, and the fourth echo time are included in a repetition time period.

11. The MRI apparatus of claim 1, wherein the image processor is further configured to:

reconstruct k-space data, based on another part of the first echo data other than the overlapping part included in the first echo data in the k-space, and the second echo data;

perform phase correction on the second echo data included in the reconstructed k-space data; and re-reconstruct the k-space data, based on the overlapping part included in the first echo data, and the second echo data on which the phase correction is performed.

12. A method of a magnetic resonance imaging (MRI) apparatus for obtaining a magnetic resonance (MR) image, based on a multi-echo sequence, the method comprising:

obtaining first echo data, based on an echo that is generated at a first echo time;

obtaining second echo data, based on an echo that is generated at a second echo time later than the first echo time, the first echo data comprising a part overlapping a part included in the second echo data in a k-space;

generating a B0 map, based on third echo data and fourth echo data that are obtained based on an echo that is generated at a third echo time and an echo that is generated at a fourth echo time, respectively;

performing phase correction on either one or both of the first echo data and the second echo data, based on the generated B0 map; and reconstructing the MR image, based on the first echo data and the second echo data.

13. The method of claim 12, further comprising performing phase correction on either one or both of the first echo data and the second echo data, wherein the reconstructing comprises reconstructing the MR image, based on either one or both of the first echo data and the second echo data on which the phase correction is performed.

14. The method of claim 12, wherein either one or each of the first echo data and the second echo data comprises data of a central part of the k-space.

15. The method of claim 14, wherein the performing comprises performing the phase correction, based on a phase of the data of the central part of the k-space among the first echo data and the second echo data.

16. A non-transitory computer-readable storage medium storing a program for causing a computer to execute the method of claim 12.

17. A magnetic resonance imaging (MRI) apparatus for obtaining a magnetic resonance (MR) image, based on a multi-echo sequence, the MRI apparatus comprising:

a data obtainer configured to:

obtain first echo data, based on an echo that is generated at a first echo time;

obtain second echo data, based on an echo that is generated at a second echo time later than the first echo time; and obtain third echo data, based on an echo that is generated at a third echo time later than the second echo time, the second echo data comprising a part overlapping a part included in the third echo data in a k-space; and an image processor configured to:

generate a B0 map, based on the first echo data and the second echo data;

perform phase correction on the third echo data, based on the generated B0 map; and reconstruct the MR image, based on the first echo data and the third echo data on which the phase correction is performed.

* * * * *